(12) United States Patent
Yu et al.

(10) Patent No.: US 7,947,588 B2
(45) Date of Patent: May 24, 2011

(54) STRUCTURE AND METHOD FOR A CMOS DEVICE WITH DOPED CONDUCTING METAL OXIDE AS THE GATE ELECTRODE

(75) Inventors: Chen-Hua Yu, Hsin-Chu (TW); Cheng-Tung Lin, Jhudong Township, Hsinchu County (TW); Hsiang-Yi Wang, Hsinchu (TW); Yung-Sheng Chiu, Hsinchu (TW); Chia-Lin Yu, Sigang Township, Tainan County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/424,153

(22) Filed: Apr. 15, 2009

(65) Prior Publication Data
US 2010/0052066 A1 Mar. 4, 2010

Related U.S. Application Data

(60) Provisional application No. 61/091,960, filed on Aug. 26, 2008.

(51) Int. Cl.
H01L 21/4763 (2006.01)
(52) U.S. Cl. .................. 438/585; 438/199; 257/E21.635

(58) Field of Classification Search .................. 257/369, 257/E21.632, E29.16, E29.127, 43, E21.635; 438/199, 585, 592
See application file for complete search history.

(56) References Cited

U.S. PATENT DOCUMENTS

| | | | |
|---|---|---|---|
| 7,109,079 B2* | 9/2006 | Schaeffer et al. | 438/199 |
| 7,129,182 B2* | 10/2006 | Brask et al. | 438/745 |
| 7,332,407 B2 | 2/2008 | Wang et al. | |
| 7,351,994 B2 | 4/2008 | Yao et al. | |
| 7,354,830 B2 | 4/2008 | Lin et al. | |
| 7,355,235 B2 | 4/2008 | Wang et al. | |
| 7,378,713 B2 | 5/2008 | Hsu et al. | |
| 2004/0004244 A1* | 1/2004 | Ahn et al. | 257/314 |
| 2005/0139926 A1* | 6/2005 | Shimizu et al. | 257/351 |
| 2006/0065939 A1* | 3/2006 | Doczy et al. | 257/412 |

* cited by examiner

*Primary Examiner* — Victor Mandala
*Assistant Examiner* — Scott Stowe
(74) *Attorney, Agent, or Firm* — Haynes and Boone, LLP

(57) ABSTRACT

A semiconductor device and method for fabricating a semiconductor device for providing improved work function values and thermal stability is disclosed. The semiconductor device comprises a semiconductor substrate; an interfacial dielectric layer over the semiconductor substrate; a high-k gate dielectric layer over the interfacial dielectric layer; and a doped-conducting metal oxide layer over the high-k gate dielectric layer.

18 Claims, 16 Drawing Sheets

STRUCTURE AND METHOD FOR A CMOS DEVICE WITH DOPED CONDUCTING METAL OXIDE AS THE GATE ELECTRODE

PRIORITY DATA

This application claims priority to Provisional Application Ser. No. 61/091,960 filed on Aug. 26, 2008, entitled "A STRUCTURE AND METHOD FOR A CMOS DEVICE WITH DOPED CONDUCTING METAL OXIDE AS THE GATE ELECTRODE," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. Current processing utilizes metal, metal carbide, and/or metal nitride for the gate electrode. However, such materials provide insufficient work function values and present thermal stability issues, particularly when utilized in an n-type MOS device (NMOS) and a p-type MOS device (PMOS), which require different work functions for their respective gate electrode.

Accordingly, what is needed is a semiconductor device that addresses the above stated issues, and a method for making such semiconductor device.

SUMMARY OF THE INVENTION

Embodiments of the present invention relate to semiconductor devices having doped-conducting metal oxide and methods for forming such semiconductor devices. The doped-conducting metal oxide can provide desired work function values and thermal stability. In one embodiment, a semiconductor device providing improved work function values comprises a semiconductor substrate; an interfacial dielectric layer over the semiconductor substrate; a high-k gate dielectric layer over the interfacial dielectric layer; and a doped-conducting metal oxide layer over the high-k gate dielectric layer.

In one embodiment, a method for fabricating a semiconductor device comprises providing a semiconductor substrate having a first active region and a second active region; forming a high-k dielectric layer over the semiconductor substrate; forming a first metal layer over the high-k dielectric layer in the first active region, the first metal layer having a first work function, and wherein the first metal layer comprises a first doped-conducting metal oxide; forming a second metal layer over the high-k dielectric layer in the second active region, the second metal layer having a second work function, and wherein the second metal layer comprises a second doped-conducting metal oxide; and forming a first gate stack in the first active region and a second gate stack in the second active region.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

DETAILED DESCRIPTION

Figure 1:
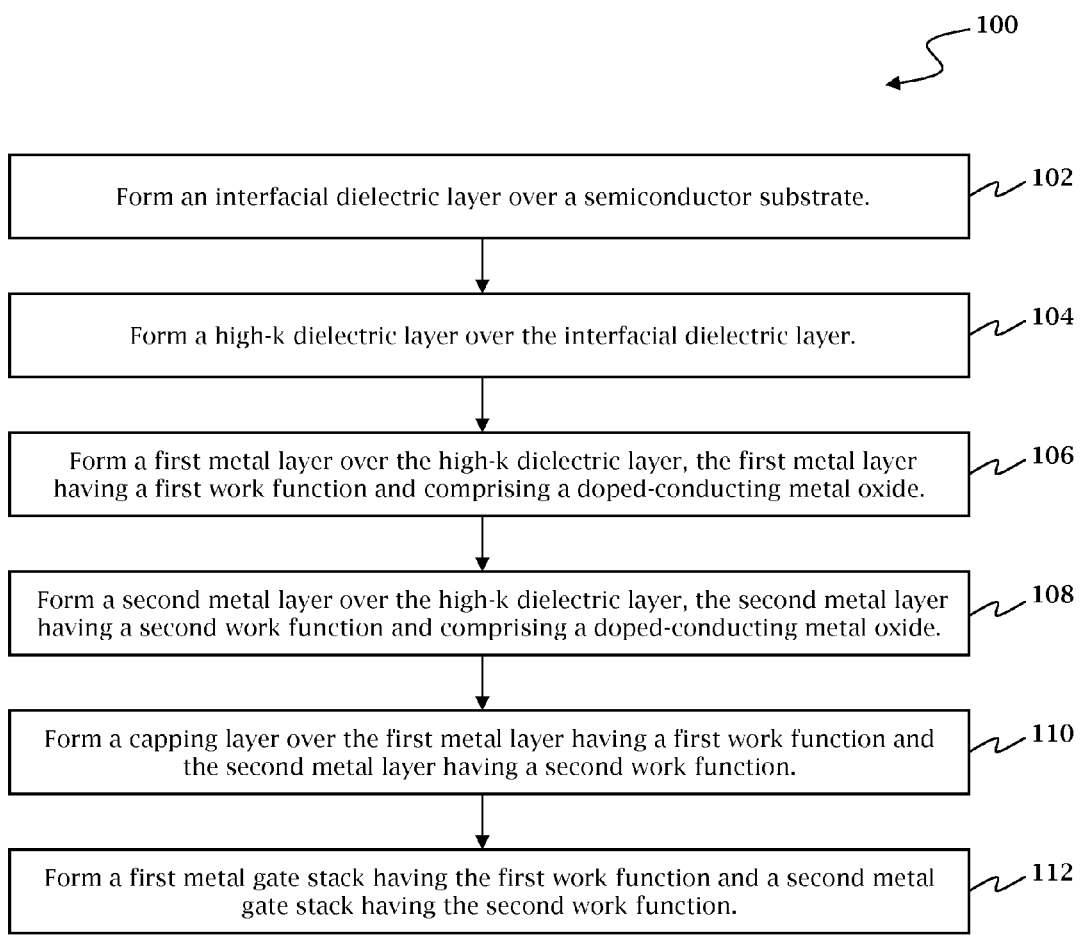
FIG. 1 is a flow chart of a method for forming a semiconductor device according to aspects of the present invention.

The present disclosure relates generally to the field of semiconductor devices, and more particularly, to a semiconductor device that exhibits improved work function values and thermal stability.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present invention relate to semiconductor devices having doped-conducting metal oxide and methods for forming such semiconductor devices. The doped-conducting metal oxide can provide desired work function values and thermal stability. In one embodiment, a semiconductor device providing desired work function values comprises a semiconductor substrate; an interfacial dielectric layer over the semiconductor substrate; a high-k gate dielectric layer over the interfacial dielectric layer; and a doped-conducting metal oxide layer over the high-k gate dielectric layer.

With reference to FIGS. 1 through 8D, methods 100, 300, 500, and 700, and semiconductor devices 200, 400, 600, and 800, are collectively described below. It is understood that additional steps can be provided before, during, and after the methods 100, 300, 500, and 700 and some of the steps described below can be replaced or eliminated, for additional embodiments of the method. It is further understood that additional features can be added in the semiconductor devices 200, 400, 600, and 800, and some of the features described below can be replaced or eliminated, for additional embodiments of the semiconductor devices 200, 400, 600, and 800. The present embodiments of methods 100, 300, 500, 700 and semiconductor devices 200, 400, 600, 800 provide a semiconductor device with improved work function values and better thermal stability.

Further, the semiconductor devices may be fabricated in a hybrid process including a gate first process and a gate last process. In the gate first process, a metal gate structure may be formed first and may be followed by CMOS process flow to fabricate the final device. In the gate last process, a dummy poly gate structure may be formed first and may be followed normal CMOS process flow until deposition of an interlayer dielectric (ILD), and then the dummy poly gate structure may be removed and replaced with a metal gate structure. In the hybrid gate process, a metal gate structure of one type of device may be formed first and a metal gate structure of another type of device may be formed last as discussed below.

Figure 2A:
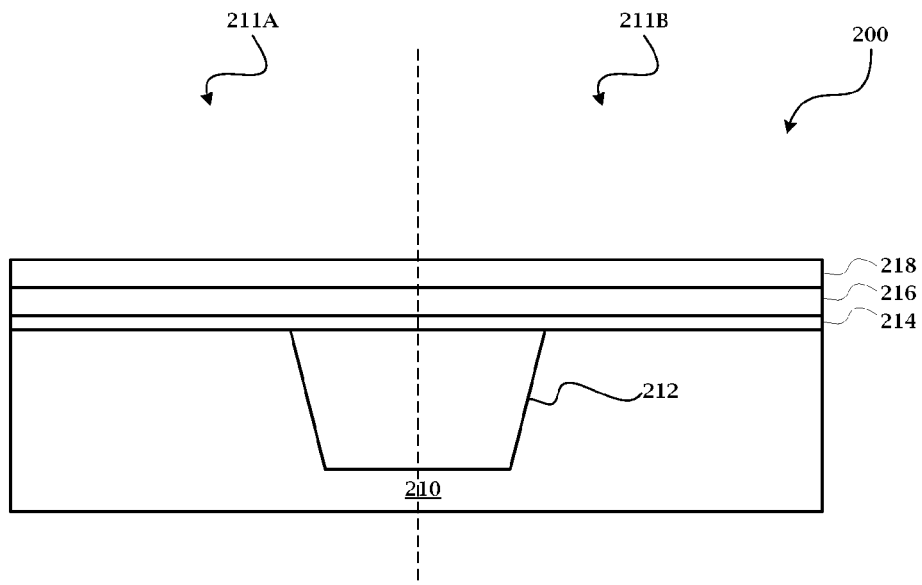
FIGS. 2A-2E are various cross-sectional views of embodiments of a semiconductor device during various fabrication stages according to the method of FIG. 1.

FIG. 1 is a flow chart of one embodiment of the method 100 for making the semiconductor device 200. FIGS. 2A-2E are various cross-sectional views of the semiconductor device 200 according to one embodiment, in portion or entirety, during various fabrication stages of the method 100. The method 100 provides for making the semiconductor device 200 in a gate-first process. Referring to FIGS. 1 and 2A, the method 100 begins at step 102 wherein a semiconductor substrate 210 including active regions 211A, 211B and at least one isolation region 212 is provided, and an interfacial dielectric layer 214 is formed over the semiconductor substrate 210.

The semiconductor substrate 210 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure. In the present embodiment, the semiconductor substrate 210 comprises silicon, germanium, a group III-V material, or a group II-VI material.

Semiconductor substrate 210 may include various doping configurations depending on design requirements as known in the art. In some embodiments, the semiconductor substrate 210 may include doped regions. The doped regions may be doped with p-type or n-type dopants. For example, the doped regions may be doped with p-type dopants, such as boron or $BF_2$; n-type dopants, such as phosphorus or arsenic; and/or combinations thereof. The doped regions may be formed directly on the semiconductor substrate, in a P-well structure, in a N-well structure, in a dual-well structure, or using a raised structure.

The semiconductor substrate 210 includes active regions 211A, 211B. In the present embodiment, the active region 211A may be configured for an N-type metal-oxide-semiconductor transistor device (referred to as an NMOS), and the active region 211B may be configured for a P-type metal-oxide-semiconductor transistor device (referred to as a PMOS). It is understood that the semiconductor device 200 may be formed by complementary metal-oxide-semiconductor (CMOS) technology processing, and thus some processes are not described in detail herein.

The at least one isolation region 212 may be formed on the semiconductor substrate 210 to isolate active regions 211A, 211B of the semiconductor substrate 210, and in the present embodiment, to isolate the NMOS and PMOS transistor device regions. The isolation region 212 may utilize isolation technology, such as local oxidation of silicon (LOCOS) or shallow trench isolation (STI), to define and electrically isolate the various active regions 211A, 211B. In the present embodiment, the isolation region 212 includes a STI. The isolation region 212 may comprise silicon oxide, silicon nitride, silicon oxynitride, fluoride-doped silicate glass (FSG), a low-K dielectric material, other suitable materials, and/or combinations thereof. The isolation region 212, and in the present embodiment, the STI, may be formed by any suitable process. As one example, the formation of an STI may include patterning the semiconductor substrate by a conventional photolithography process, etching a trench in the substrate (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

The semiconductor device 200 further includes the interfacial dielectric layer 214 formed over the substrate 210. The interfacial dielectric layer 214 may be formed by any suitable process and any suitable thickness. For example, in the present embodiment, the interfacial layer 214 may include a grown silicon oxide layer having a thickness of approximately 4 angstroms (Å). In some embodiments, before the interfacial dielectric layer 214 is grown over the substrate 210, a HF-last pre-gate clean (e.g., utilizing an HF solution) and UV process may be performed.

At step 104, a high-k dielectric layer 216 is formed over the interfacial dielectric layer 214. The high-k dielectric layer 216 may include hafnium oxide ($HfO_2$). In the present embodiment, the high-k dielectric layer 216 includes hafnium oxide having a thickness of approximately 20 Å. Alternatively, the high-k dielectric layer 216 may optionally include other high-k dielectric materials such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, other suitable materials, and/or combinations thereof. The high-k dielectric layer 216 may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

In some embodiments, a diffusion barrier/protection layer 218 is formed over the high-k dielectric layer 216. The diffusion barrier/protection layer 218 may comprise titanium, titanium nitride (TiN), tantalum, tantalum nitride, other suitable material, and/or combinations thereof. In the present embodiment, the diffusion barrier/protection layer 218 comprises TiN, which is deposited by PVD to a thickness of approximately 20 Å. In alternate embodiments, the diffusion barrier/protection layer may be formed by any suitable process, such as CVD, PVD, ALD, thermal oxide, plating, and/or combinations thereof. Further, in alternate embodiments, the diffusion barrier layer 218 comprises any suitable thickness. It is understood that the diffusion barrier layer 218 may be omitted in alternate embodiments.

Figure 2B:
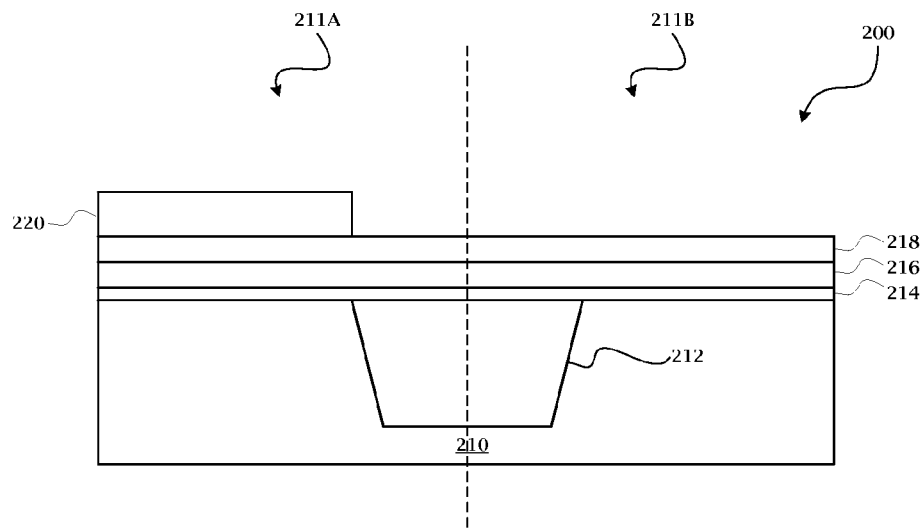
Figure 2C:
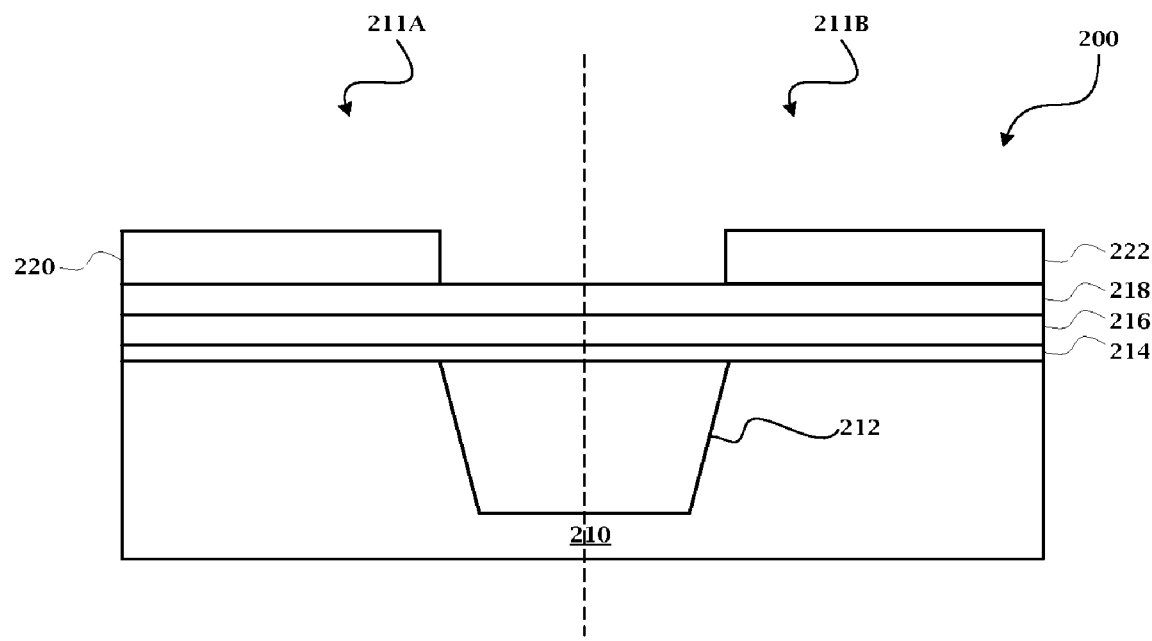

Referring to FIGS. 1 and 2B, the method 100 proceeds to step 106 by forming a first metal layer 220 over the high-k dielectric layer 216, or in the present embodiment, over the diffusion barrier/protection layer 218, wherein the first metal layer 220 comprises a material with a first work function. The first metal layer 220 is formed within active region 211A, the NMOS region. Referring to FIGS. 1 and 2C, the method 100 proceeds to step 108 by forming a second metal layer 222 over the high-k dielectric layer 216, or in the present embodiment, over the diffusion barrier/protection layer 218, wherein the second metal layer 222 comprises a material with a second work function. The second metal layer 222 is formed within active region 211B, the PMOS region.

The first metal layer 220 and the second metal layer 222 may be formed by any suitable process. For example, the metal layers 220, 222 may be formed by conventional deposition processes, photolithography patterning processes, etching processes, and/or combinations thereof. The deposition processes may include PVD, CVD, ALD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the metal layers 220, 222 may be formed by any combination of the processes described above.

Conventional metal layers utilized in metal gate structures comprise metal, metal carbide, and/or metal nitride. For example, conventional metal layer 220 would comprise metal carbide (e.g., TaC) in the active/NMOS region 211A, and conventional metal layer 222 would comprise metal nitride (e.g., Mo$_2$N) in the active/PMOS region 211B. However, these conventional metal layers provide insufficient work function values and insufficient thermal stability.

The present embodiment provides metal layers 220, 222 with correct work function values (e.g., more band-edge work function for doped-channel device, mid-gap work function for depleted channel device, etc.) and better thermal stability. Such improved work function values and thermal stability is achieved by the metal layers 220, 222 comprising a doped-conducting metal oxide (DCO). The DCO may comprise SnO$_2$, In$_2$O$_3$, ZnO, CdO, and/or combinations thereof; SnO$_2$ doped with Sb, F, As, Nb, Ta, and/or combinations thereof; In$_2$O$_3$ doped with Zn, Ge, Mo, F, Ti, Zr, Hf, Nb, Ta, W, Te, Ga, Mg, Sn, and/or combinations thereof; ZnO doped with Al, Ga, B, In, Y, Sc, F, V, Si, Ge, Ti, Zr, Hf, and/or combinations thereof; CdO doped with In, Sn, and/or combinations thereof; CdSb$_2$O$_6$ doped with Y; other suitable materials; and/or combinations thereof (e.g., ZnO doped with SnO$_2$; ZnO doped with In$_2$O$_3$; ZnO doped with In$_2$O$_3$ doped with SnO$_2$). The DCO may comprise a transparent conducting oxide (TCO), which may include SnO$_2$, In$_2$O$_3$, ZnO, CdO, and/or combinations thereof. TCOs are widely utilized in semiconductor technologies, such as in p-electrodes of LEDs, OLED anodes, UV sensors, solar cells, laser diodes, thin film transistors (TFTs), and flash memories. Accordingly, utilizing DCO materials for metal layers 220, 222 provides optimal tuning of the work functions of the varying compositions of metal layers.

Table 1 below provides DCOs that are well-suited for obtaining desirable p-type work functions, n-type work functions, and mid-gap work functions.

TABLE 1

| Doped-Conducting Metal Oxides (DCOs) | | | | |
|---|---|---|---|---|
| | | DCO | Work Function (eV) | Resistivity (ohm-cm) |
| p-gate | ITO | In$_2$O$_3$:Sn | 4.7-5.1 | ~1e−4 as dep |
| | GZO | ZnO:Ga | 5.3 | ~1e−4 @ 900 C. |
| | ZZO | ZnO:Zr | 5.5 | |
| | IZO | ZnO:In | 4.9-5.2 | 3e−4 @ 600 C. |
| | IZTO | In$_2$O$_3$:ZnO&SnO$_2$ | 6.1 5.12 | 4e−4 as dep |
| | TZO | ZnO:SnO$_2$ or Sn | >5 | |
| | GIO | In$_2$O$_3$:Ga | 5.4 | |
| midgap | IMO | In$_2$O$_3$:Mo | 4.6 | 7.8e−4 as dep 2.3e−4 @ 700 C. |
| n-gate | AZO | ZnO:Al | 3.7-4.4 | ~2e−4 |

For example, in the active/NMOS region 211A, first metal layer 220 may comprise a DCO referred to as AZO, which includes ZnO doped with Al. The AZO results in a desirable n-type work function for the active/NMOS region 211A, as evident from Table 1 that shows the work function of the AZO ranging from approximately 3.7 eV to 4.4 eV. In the active/PMOS region 211B, the second metal layer 222 may comprise a DCO referred to as ITO, which includes In$_2$O$_3$ doped with Sn; GZO, which includes ZnO doped with Ga; ZZO, which includes ZnO doped with Zr; IZO, which includes ZnO doped with In; IZTO, which includes In$_2$O$_3$ doped with ZnO and SnO$_2$; TZO, which includes ZnO doped with SnO$_2$ or Sn; or GIO, which includes In$_2$O$_3$ doped with Ga. The ITO, GZO, ZZO, IZO, IZTO, TZO, and GIO result in desirable p-type work functions for the active/PMOS region 211B, as evident from Table 1 that shows work functions ranging from approximately 4.7 eV to 6.1 eV. In some embodiments, a mid-gap work function metal may be desired, and accordingly, the metal layers 220, 222 may comprise a DCO referred to as IMO, which includes $In_2O_3$ doped with Mo, providing a work function value of approximately 4.6 eV. In the present embodiment, the first metal layer 220 comprises an n-type work-function material, AZO, which includes ZnO doped with Al, and the second metal layer 222 comprises a p-type work function material, ZZO, which includes ZnO doped with Zr. In some embodiments, the first metal layer 220 and the second metal layer 222 may each have a thickness between about 20 Å and about 1,000 Å. In alternate embodiments, the metal layers 220, 222 may comprise any suitable thickness. In some embodiments, the metal layers 220, 222 may both comprise a p-type work function material, wherein each metal layer comprises a similar or different work function value. In alternate embodiments, the metal layers 220, 222 may both comprise an n-type work function material or a mid-gap work function material, wherein each metal layer comprises material with similar or different work function values.

Figure 2D:
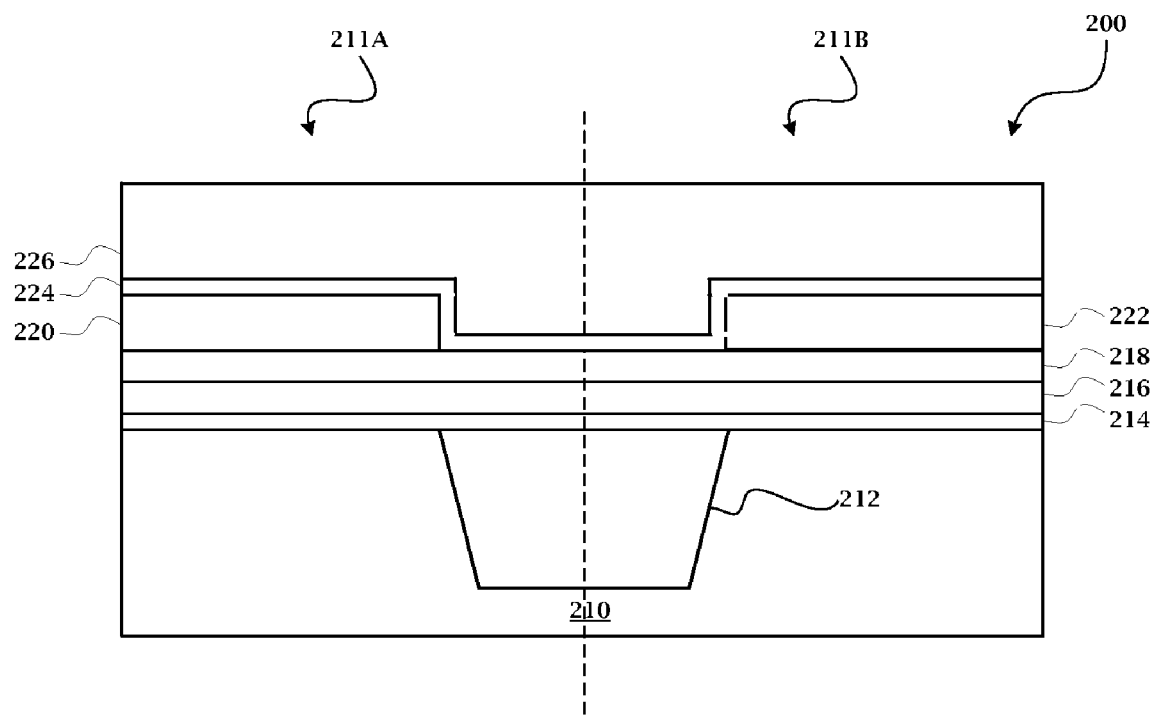

A diffusion barrier layer 224 may be formed over the semiconductor device 200, particularly, metal layers 220, 222 as illustrated in FIG. 2D. The diffusion barrier layer may comprise titanium, titanium nitride, tantalum, tantalum nitride, other suitable material, and/or combinations thereof. In the present embodiment, the diffusion barrier layer 224 comprises TiN, which is deposited by PVD to a thickness of approximately 50 Å. In alternate embodiments, the diffusion barrier layer may be formed by any suitable process, such as CVD, PVD, ALD, thermal oxide, plating, and/or combinations thereof. Further, in alternate embodiments, the diffusion barrier layer 224 comprises any suitable thickness. It is understood that the diffusion barrier layer 224 may be omitted for alternate embodiments.

At step 110, referring to FIGS. 1 and 2D, a capping layer 226 is formed over the metal layers 220, 222, and in the present embodiment, over the diffusion barrier layer 224. The capping layer 226 may comprise polycrystalline silicon; silicon-containing materials; germanium-containing materials; metal, such as aluminum, copper, tungsten, titanium, tantalum, titanium nitride, tantalum nitride, nickel silicide, cobalt silicide; other proper conductive materials; and combinations thereof. In the present embodiment, the capping layer 226 comprises polysilicon having a thickness between about 200 Å and about 1,000 Å, preferably about 600 Å. In some embodiments, the capping layer 226 may include metal (e.g., an aluminum-based, tungsten, or copper material), which may be used in a gate last-process and comprise a thickness between about 50 Å and about 1,000 Å, preferably about 200 Å. In alternate embodiments, the capping layer 226 may comprise any suitable thickness. The capping layer 226 may be formed by CVD, PVD, ALD, thermal oxide, plating, other suitable processes, and/or combinations thereof. In some embodiments, the capping layer 226 comprises aluminum and/or tungsten. For example, in some embodiments, the capping layer 226 comprises aluminum formed by CVD. It is understood that, in alternate embodiments, the capping layer 226 may comprise multilayer structures.

Figure 2E:
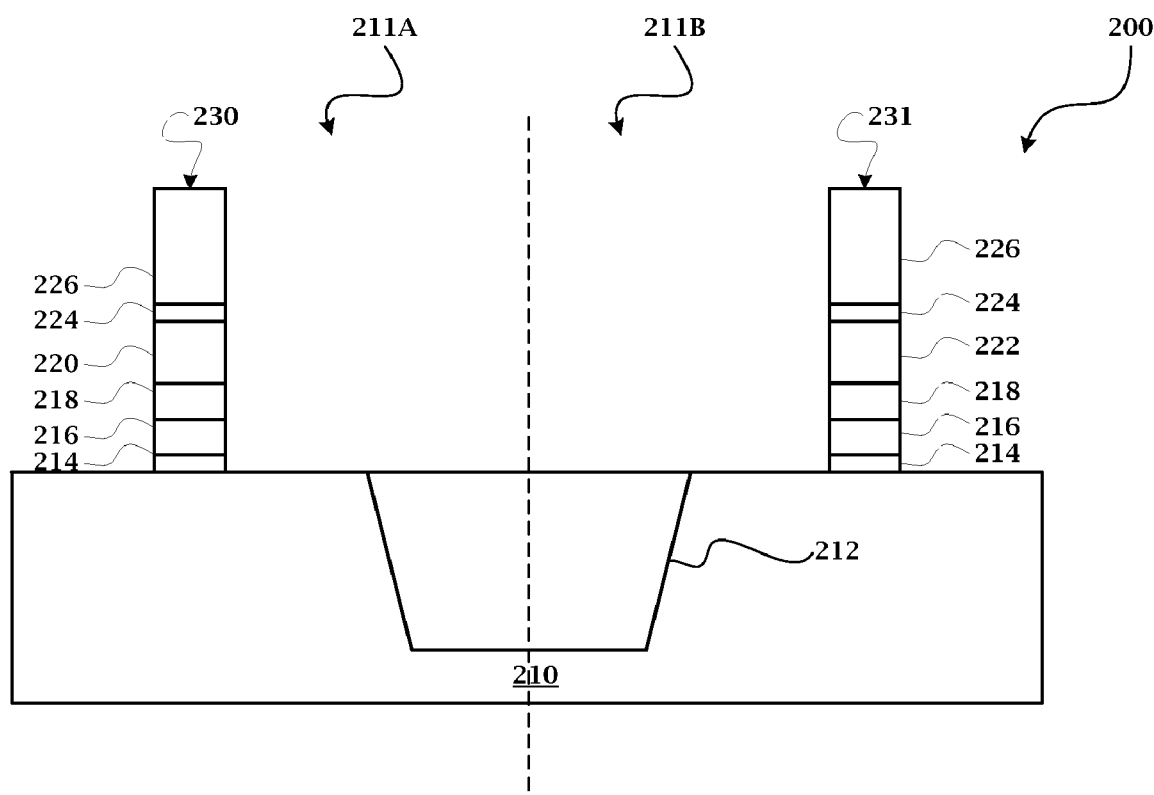

Referring to FIGS. 1 and 2E, at step 112, a first metal gate stack 230 with a first work function in the active/NMOS region 211A and a second metal gate stack 231 with a second work function in the active/PMOS region 211B are formed. In the present embodiment, the first metal gate stack 230 comprises the metal layer 220 including the n-type work function material, AZO, which includes ZnO doped with Al (i.e., the first work function), and the second metal gate stack 231 comprises the metal layer 222 including the p-type work function material, ZZO, which includes ZnO doped with Zr (i.e., the second work function).

The first metal gate stack 230 and the second metal gate stack 231 may be formed by any suitable process. For example, the metal gate stacks 230, 231 may be formed by conventional deposition, photolithography patterning, and etching processes, and/or combinations thereof. The deposition processes may include PVD, CVD, ALD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the metal gate stacks 230, 231 may be formed by any combination of the processes described above.

In one example, for patterning the metal gate stacks 230, 231, a layer of photoresist is formed over the capping layer 226 by a suitable process, such as spin-on coating, and then patterned to form a patterned photoresist feature by a proper lithography patterning method. The pattern of the photoresist can then be transferred by a dry etching process to the underlying layers (i.e., the interfacial dielectric layer 214, the high-k dielectric layer 216, the diffusion barrier/protection layer 218, the first metal layer 220, the second metal layer 222, the diffusion barrier layer 224, and the capping layer 226) to form the metal gate stacks 230, 231 as shown in FIG. 2E. The photoresist layer may be stripped thereafter. In another example, a hard mask layer is formed over the capping layer 226; a patterned photoresist layer is formed on the hard mask layer; the pattern of the photoresist layer is transferred to the hard mask layer and then transferred to the electrode layers to form the electrode layers and dielectric layers of the gate structures. It is understood that the above examples do not limit the processing steps that may be utilized to form the metal gate stacks 230, 231.

It is understood that the semiconductor device 200 may undergo further CMOS or MOS technology processing to form various features known in the art. For example, gate sidewall spacers may be formed on both sides of the metal gate stacks 230, 231 by a deposition and etching process. In some embodiments, lightly doped regions (referred to as LDD regions) may be formed in the substrate 210 using any suitable process, such as ion implantation, and any suitable dopants. In another example, source and drain regions (referred to as S/D regions) may be formed in the substrate 210 using ion implantation or diffusion with suitable dopants (depending on the configuration of the device such as NMOS and PMOS) and located proximate to each end of the metal gate stacks 230, 231 (the high-k gate dielectric and metal gate electrode), respectively. In still another example, various contacts/vias and multilayer interconnect features (e.g., metal layers and interlayer dielectrics) may be formed on the substrate 210 and configured to connect the various features or structures of the semiconductor device 200.

Figure 3:
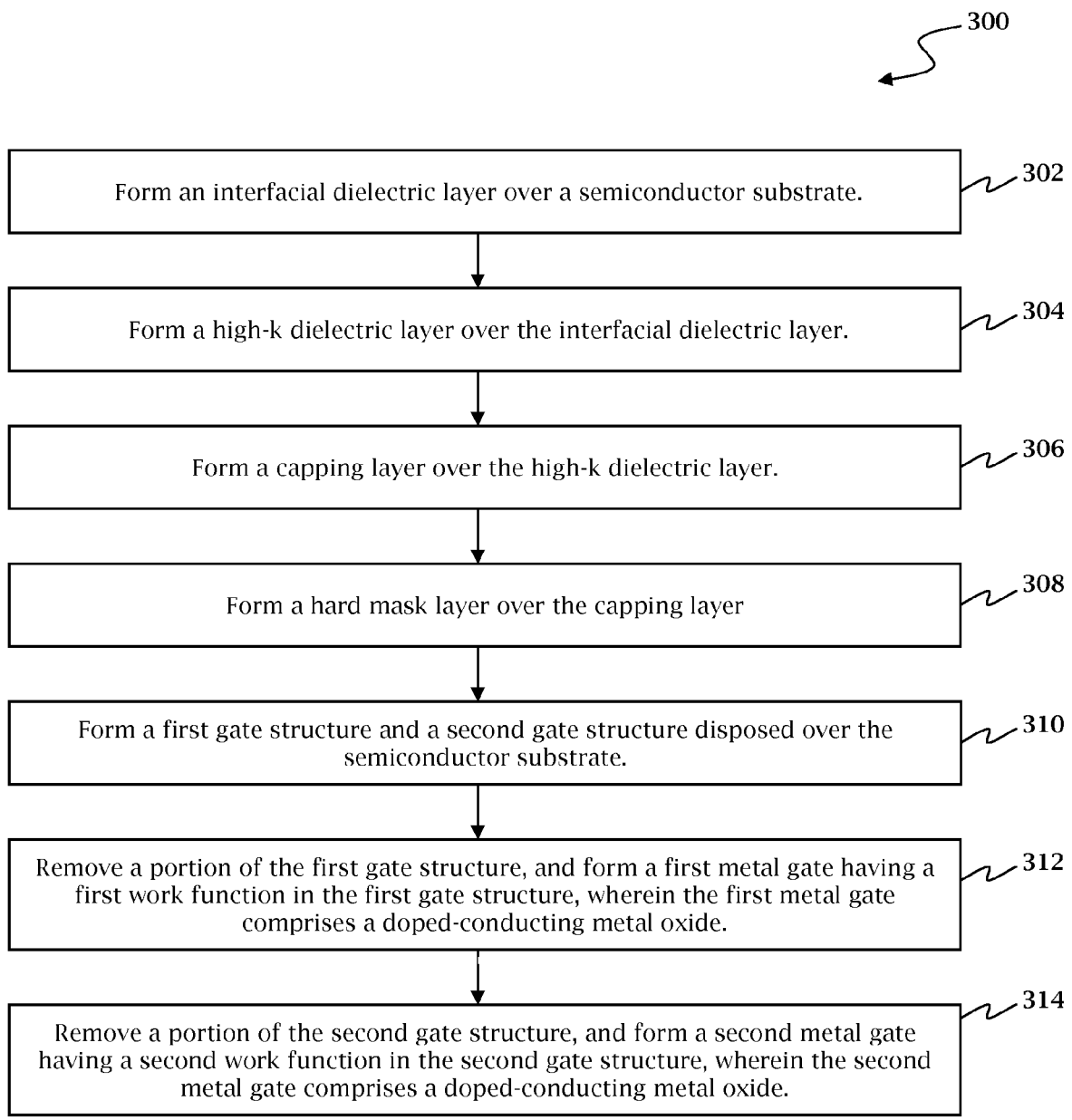
FIG. 3 is a flow chart of a method for forming a semiconductor device according to aspects of the present invention.
Figure 4A:
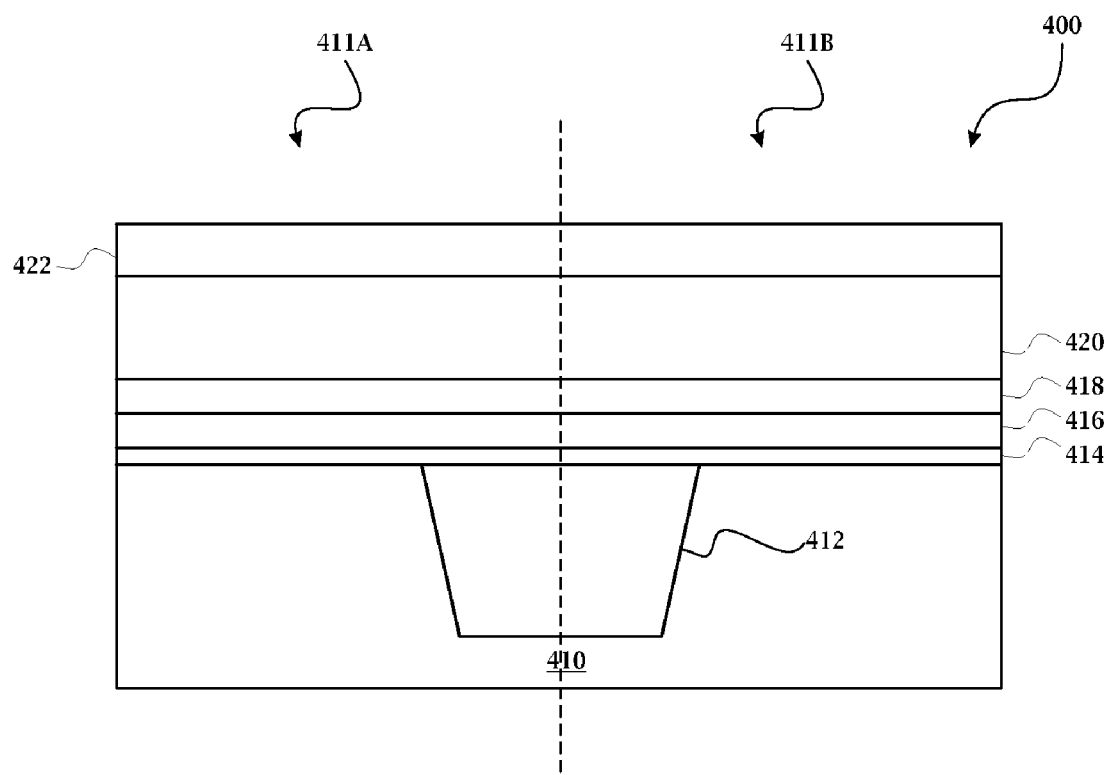
FIGS. 4A-4E are various cross-sectional views of embodiments of a semiconductor device during various fabrication stages according to the method of FIG. 3.

FIG. 3 is a flow chart of one embodiment of the method 300 for making the semiconductor device 400. FIGS. 4A-4E are various cross-sectional views of the semiconductor device 400 according to one embodiment, in portion or entirety, during various fabrication stages of the method 300. The method 300 provides for making the semiconductor device 400 in a hybrid gate-first/gate-last process. Referring to FIGS. 3 and 4A, the method 300 begins at step 302 wherein a semiconductor substrate 410 including active regions 411A, 411B and at least one isolation region 412 is provided, and an interfacial dielectric layer 414 is formed over the semiconductor substrate 410.

The semiconductor substrate 410 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure. In the present embodiment, the semiconductor substrate 410 comprises silicon, germanium, a group III-V material, or a group II-VI material.

Semiconductor substrate 410 may include various doping configurations depending on design requirements as known in the art. In some embodiments, the semiconductor substrate 410 may include doped regions. The doped regions may be doped with p-type or n-type dopants. For example, the doped regions may be doped with p-type dopants, such as boron or $BF_2$; n-type dopants, such as phosphorus or arsenic; and/or combinations thereof. The doped regions may be formed directly on the semiconductor substrate, in a P-well structure, in a N-well structure, in a dual-well structure, or using a raised structure.

The semiconductor substrate 410 includes active regions 411A, 411B. In the present embodiment, the active region 411A may be configured for an NMOS, and the active region 411B may be configured for a PMOS. It is understood that the semiconductor device 400 may be formed by CMOS technology processing, and thus some processes are not described in detail herein.

The at least one isolation region 412 may be formed on the semiconductor substrate 410 to isolate active regions 411A, 411B of the semiconductor substrate 410, and in the present embodiment, to isolate the NMOS and PMOS transistor device regions. The isolation region 412 may utilize isolation technology, such as LOCOS or STI, to define and electrically isolate the various active regions 411A, 411B. In the present embodiment, the isolation region 412 includes a STI. The isolation region 412 may comprise silicon oxide, silicon nitride, silicon oxynitride, fluoride-doped silicate glass (FSG), a low-K dielectric material, other suitable materials, and/or combinations thereof. The isolation region 412, and in the present embodiment, the STI, may be formed by any suitable process.

The semiconductor device 400 may further include the interfacial dielectric layer 414 formed over the substrate 410. The interfacial dielectric layer 414 may be formed by any suitable process and any suitable thickness. For example, in the present embodiment, the interfacial layer 414 may include a grown $SiO_2$ layer having a thickness of approximately 4 Å. The interfacial layer 414 may further comprise SiON. In some embodiments, before the interfacial dielectric layer 414 is grown over the substrate 410, a HF-last pre-gate clean (e.g., utilizing an HF solution) and UV process may be performed. In some embodiments, the interfacial layer 414 may be formed by rapid thermal oxidation. Further, in some embodiments, the interfacial layer 414 may be omitted entirely.

At step 304, a high-k dielectric layer 416 is formed over the interfacial dielectric layer 414. The high-k dielectric layer 416 may include $HfO_2$. In the present embodiment, the high-k dielectric layer 416 includes hafnium oxide having a thickness of approximately 20 Å. Alternatively, the high-k dielectric layer 416 may optionally include other high-k dielectric materials such as HfSiO, HfSiON, HfTaO, HfTiO, HfZrO, other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof. The high-k dielectric layer 416 may be formed by any suitable process, such as ALD, CVD, PVD, RPCVD, PECVD, MOCVD, sputtering, plating, other suitable processes, and/or combinations thereof.

In some embodiments, a diffusion barrier/protection layer 418 may be formed over the high-k dielectric layer 416. The diffusion barrier/protection layer 418 may comprise titanium, titanium nitride, tantalum, tantalum nitride, other suitable material, and/or combinations thereof. In the present embodiment, the diffusion barrier layer 418 comprises TiN, which is deposited by PVD to a thickness of approximately 20 Å. In alternate embodiments, the diffusion barrier/protection layer may be formed by any suitable process, such as CVD, PVD, ALD, thermal oxide, plating, and/or combinations thereof. Further, in alternate embodiments, the diffusion barrier/protection layer 418 comprises any suitable thickness. It is understood that the diffusion barrier/protection layer 418 may be omitted in alternate embodiments.

The method 300 proceeds to step 306 where a capping layer 420 is formed over the high-k dielectric layer 416, and in the present embodiment, over the diffusion barrier/protection layer 418. The capping layer 420 may comprise polycrystalline silicon; silicon-containing materials; germanium-containing materials; metal, such as aluminum, copper, tungsten, titanium, tantulum, titanium nitride, tantalum nitride, nickel silicide, cobalt silicide; other proper conductive materials; and/or combinations thereof. In the present embodiment, the capping layer 420 comprises polysilicon having a thickness between about 200 Å and about 1,000 Å, preferably about 600 Å. In some embodiments, the capping layer 420 may include metal (e.g., an aluminum-based, tungsten, or copper material), which may be used in a gate last-process and comprise a thickness between about 50 Å and about 1,000 Å, preferably about 200 Å. In alternate embodiments, the capping layer 420 may comprise any suitable thickness. The capping layer 420 may be formed by CVD, PVD, ALD, thermal oxide, plating, other suitable processes, and/or combinations thereof. In some embodiments, the capping layer 420 comprises aluminum and/or tungsten. For example, in some embodiments, the capping layer 420 comprises aluminum formed by CVD. It is understood that, in alternate embodiments, the capping layer 420 may comprise multilayer structures.

At step 308, a hard mask layer 422 is formed over the capping layer 420. In the present embodiment, the hard mask layer 422 comprises a nitrogen-containing material, such as silicon nitride, silicon oxynitride, other suitable nitrogen-containing materials, and/or combinations thereof. In alternate embodiments, the hard mask layer may include an amorphous carbon material, silicon carbide, other suitable dielectric materials, and/or combinations thereof. The hard mask layer 422 may be formed by any suitable process, such as PVD, CVD, PECVD, RTCVD, ALD, MOCVD, other suitable processes, and/or combinations thereof. The hard mask layer 422 may include a single layer or multiple layers. Further, the hard mask layer 422 comprise any suitable thickness. In the present embodiment, the hard mask layer 422 comprises a thickness of approximately 200 Å.

Figure 4B:
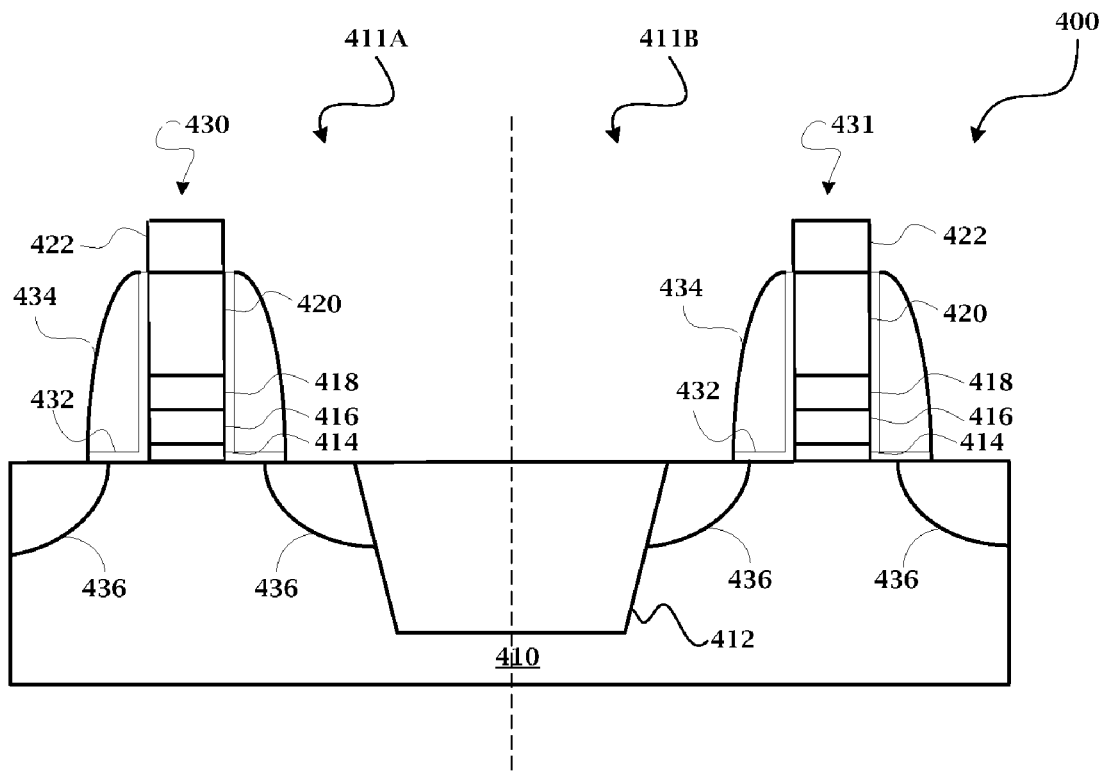

Referring to FIGS. 3 and 4B, at step 310, at least one gate structure is formed over the semiconductor substrate 410. In the present embodiments, a first gate structure 430 is formed within the active/NMOS region 411A, and a second gate structure 431 is formed within the active/PMOS region 411B. The gate structures 430, 431 include gate stacks having interfacial dielectric layer 414, high-k dielectric layer 416, diffusion barrier/protection layer 418, capping layer 420, and hard mask layer 422; gate spacer liner 432; and gate spacers 434.

The first gate structure 430 and the second gate structure 431 may be formed by any suitable process. For example, the gate structures 430, 431 may be formed by conventional deposition, photolithography patterning, and etching processes, and/or combinations thereof. The deposition processes may include PVD, CVD, ALD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the gate structures 430, 431 may be formed by any combination of the processes described above.

In one example, for patterning the gate stacks of the gate structures 430, 431 having interfacial dielectric layer 414, high-k dielectric layer 416, diffusion barrier/protection layer 418, capping layer 420, and hard mask layer 422, a layer of photoresist is formed over the hard mask layer 422 by a suitable process, such as spin-on coating, and then patterned to form a patterned photoresist feature by a proper lithography patterning method. The pattern of the photoresist can then be transferred by a dry etching process to the underlying layers (i.e., the interfacial dielectric layer 414, the high-k dielectric layer 416, the diffusion barrier/protection layer 418, the capping layer 420, and the hard mask layer 422) to form the gate stacks as shown in FIG. 4B. The photoresist layer may be stripped thereafter. It is understood that the above examples do not limit the processing steps that may be utilized to form the metal gate stacks 430, 431.

The gate structures 430, 431 further include gate spacer liner 432 and gate spacers 434. The gate spacer liner 432 may comprise any suitable material and be formed by any suitable process. In the present embodiment, the gate spacer liner 432 comprises a spacer oxide. In alternate embodiments, the gate spacer liner 432 may be omitted entirely. Still, in other embodiments, the gate spacer liner 432 may comprise multiple layers.

The gate spacers 434, which are positioned on each side of the gate stacks of gate structures 430, 431 may comprise a dielectric material such as silicon nitride, silicon oxide, silicon carbide, silicon oxynitride, other suitable materials, or combinations thereof. In some embodiments, the gate spacers 434 may comprise a multilayer structure. The spacers 434 may be formed by depositing the dielectric material by CVD, ALD, PVD, and/or other suitable processes and then etching. In the present embodiment, the spacers 434 comprise silicon nitride.

The semiconductor device 400 may further comprise doped regions 436. Doped regions 436 may be formed in the substrate 410 located proximate to each end of the gate structures 430, 431 (high-k gate dielectric and metal gate electrode), respectively, and may comprise various doping profiles. The doped regions 436 may be doped heavily or lightly and n-type or p-type. In alternate embodiments, the doped regions may be formed directly on the semiconductor substrate, in a P-well structure, in a N-well structure, in a dual-well structure, or using a raised structure. The doped regions 436 are formed by any suitable process, such as ion implantation and/or a rapid thermal process (RTP) to activate the doped regions. In some embodiments, the doped regions 436 may be formed by a plurality of ion implantation processes, such as lightly doped drain (LDD) implant processes and source/drain (S/D) implant processes.

In some embodiments, a silicide may be formed in the doped regions 436. The silicide may also be formed in the gate structures 430, 431. The silicide may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include a RTP. The reacted silicide may require a one step RTP or multiple step RTPs. In the present embodiment, the doped regions 436 include nickel silicide regions.

Figure 4C:
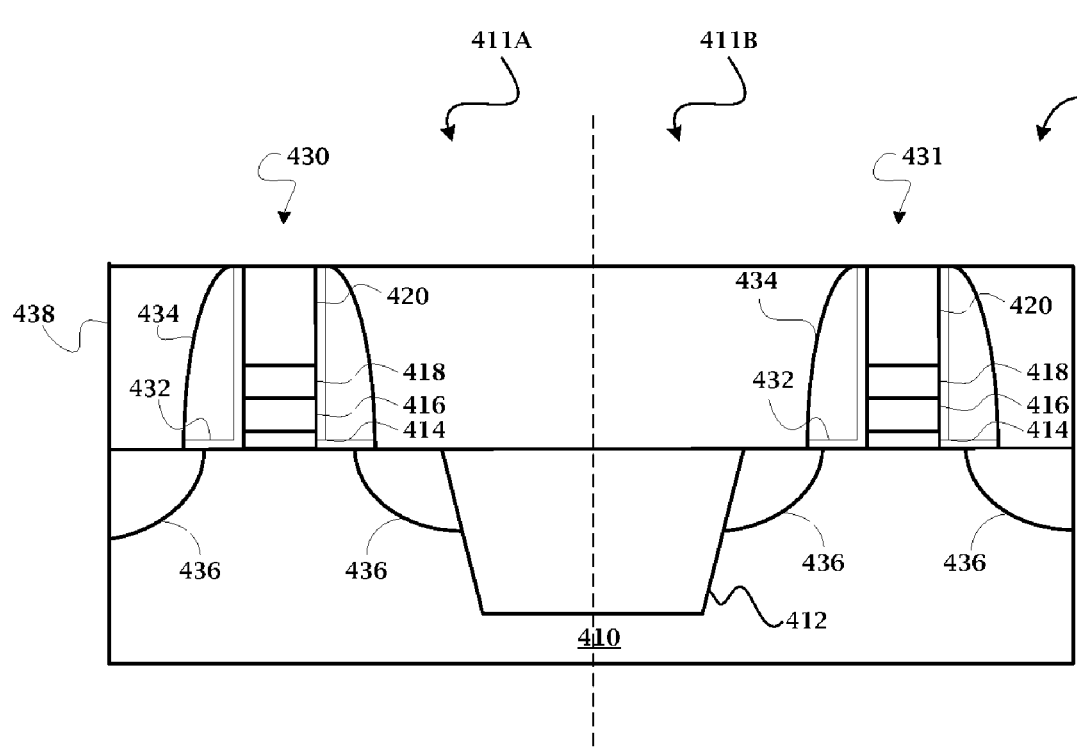

Referring to FIGS. 3 and 4C, the hard mask layer 422 disposed over the capping layer 420 of gate structures 430, 431 is removed. The hard mask layer 422 may be removed by any suitable process. For example, removing the hard mask layer 422 may include forming a photoresist layer over the semiconductor device 400; patterning the photoresist layer by a conventional photolithography process; and etching the photoresist layer to remove the hard mask layer 422. Subsequently, the photoresist layer may be removed. In the present embodiment, an interlevel dielectric layer (ILD) 438 is formed over the semiconductor device 400 by any suitable process, such as CVD, HDPCVD, spin-on, sputtering, other suitable methods, and/or combinations thereof. The ILD layer 438 may comprise any suitable material, such as silicon oxide, silicon oxynitride, low-k material, and/or other suitable materials. As illustrated in FIG. 4C, a chemical mechanical polish (CMP) of the ILD 438 is performed until the hard mask layer 422 is exposed, and then an etching process, such as dry and/or wet etching, is performed to remove the hard mask layer 422.

Figure 4D:
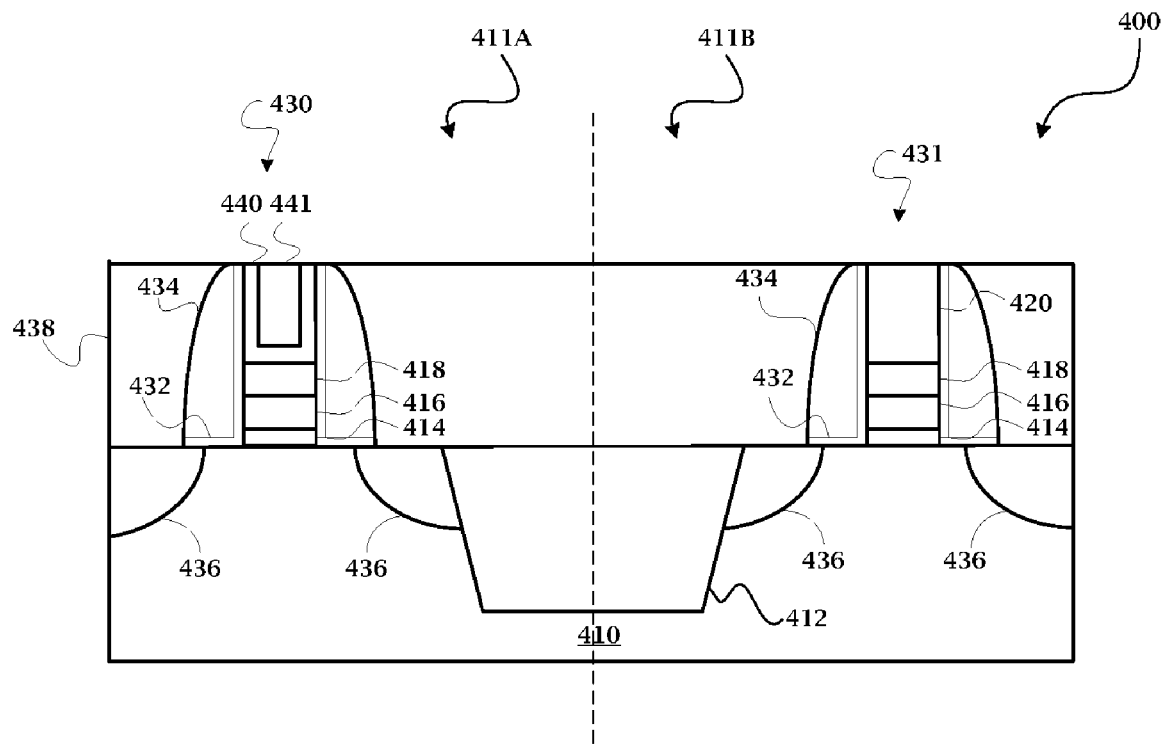
Figure 4E:
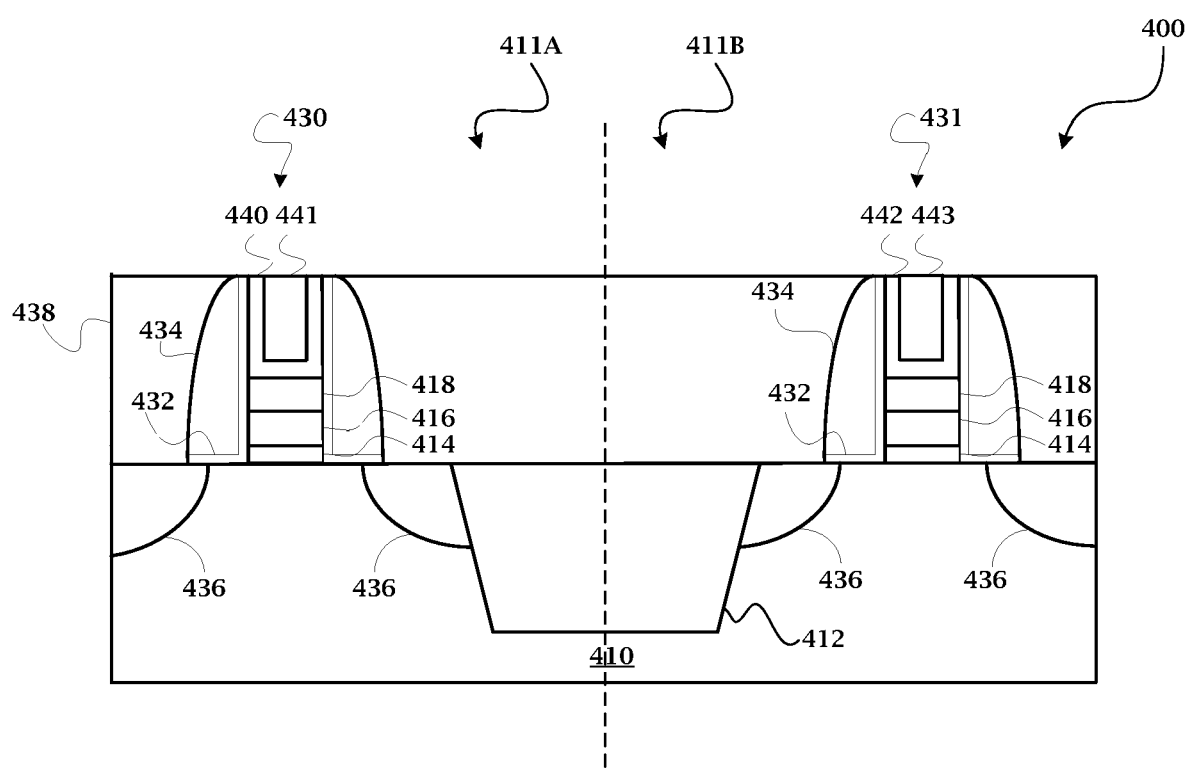

After the hard mask layer 422 is removed, the capping layer 420 may be removed from the gate structures 430, 431 by any suitable process, such as an etching process. The capping layer 420 may be removed from gate structures 430, 431 simultaneously or independently. Referring to FIGS. 3 and 4D, at step 312, a portion of the first gate structure 430 is removed to form a first metal gate having a first work function in the first gate structure 430. Referring to FIGS. 3 and 4E, at step 314, a portion of the second gate structure 431 is removed to form a second metal gate having a second work function in the second gate structure 431.

In the present embodiment, the portion removed from the gate structures 430, 431 is the capping layer 420. The first metal gate may be formed where the capping layer 420 in the gate structure 430 has been removed, and the second metal gate may be formed where the capping layer 420 in the gate structure 431 has been removed. The first metal gate including a first metal region 440 having a first work function and a bulk metal region 441 is formed in the first gate structure 430. The second metal gate including a second metal region 442 having a second work function and a bulk metal region 443 is formed in the second gate structure 431. It is understood that the capping layer 420 may be removed from the gate structures 430, 431 in any order, and the example herein does not limit the capping layer 420 removal process. It is further understood that the metal gates may be formed utilizing any suitable process.

As noted above, conventional metal layers utilized in metal gate structures comprise metal, metal carbide, and/or metal nitride, which materials provide insufficient work function values and insufficient thermal stability. The present embodiment provides first metal region 440 and second metal region 442 with correct work function values and better thermal stability. Such improved work function values and thermal stability is achieved by the metal regions 440, 442 comprising a DCO. The DCO may comprise $SnO_2$, $In_2O_3$, ZnO, CdO, and/or combinations thereof; $SnO_2$ doped with Sb, F, As, Nb, Ta, and/or combinations thereof; $In_2O_3$ doped with Zn, Ge, Mo, F, Ti, Zr, Hf, Nb, Ta, W, Te, Ga, Mg, Sn, and/or combinations thereof; ZnO doped with Al, Ga, B, In, Y, Sc, F, V, Si, Ge, Ti, Zr, Hf, and/or combinations thereof; CdO doped with In, Sn, and/or combinations thereof; $CdSb_2O_6$ doped with Y; other suitable materials; and/or combinations thereof (e.g., ZnO doped with $SnO_2$; ZnO doped with $In_2O_3$, ZnO doped with $In_2O_3$ doped with $SnO_2$). The DCO may comprise a TCO, which may include $SnO_2$, $In_2O_3$, ZnO, CdO, and/or combinations thereof. Further, Table 1 above provides DCOs that are well-suited for obtaining desirable p-type work functions, n-type work functions, and mid-gap work functions. Accordingly, utilizing DCO materials for metal regions 440, 442 provides optimal tuning of the work functions of the varying compositions of metal layers. In the present embodiment, the first metal region 440 having the first work function in the active/NMOS region 411A comprises a n-type work function material, AZO, which includes ZnO doped with Al; and the second metal region 442 having a second work function in the active/PMOS region 411B comprises a p-type work function material, ZZO, which includes ZnO doped with Zr. In some embodiments, the first metal region 440 and the second metal region 442 may each have a thickness between about 20 Å and about 1,000 Å. In some embodiments, the first metal region 440 and the second metal region 442 may each comprise a thickness of about 200 Å. In some embodiments, the metal regions 440, 442 may both comprise a p-type work function material, wherein each metal layer comprises a similar or different work function value. In alternate embodiments, the metal regions 440, 442 may both comprise an n-type work function material or a mid-gap work function material, wherein each metal layer comprises material with similar or different work function values.

The metal regions 440, 442 may be formed by any suitable process. For example, the metal layers 440, 442 may be formed by conventional deposition, photolithography patterning, and etching processes, and/or combinations thereof. The deposition processes may include PVD, CVD, ALD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the metal layers 440, 442 may be formed by any combination of the processes described above.

Bulk metal regions 441, 443 are formed over the metal regions 440, 442. The bulk metal regions 441, 443 may be formed by any suitable processes, such as deposition, photolithography, and etching processes, and/or combinations thereof. In the present embodiment, the bulk metal regions 441, 443 comprise aluminum deposited by CVD, followed by a CMP. In alternate embodiments, the bulk metal regions 441, 443 may comprise any suitable material, such as copper, tungsten, titanium, tantulum, titanium nitride, tantalum nitride, nickel silicide, cobalt silicide; other proper conductive materials; and combinations thereof. Further, in some embodiments, the bulk metal regions 441, 443 may not comprise identical materials. It is understood that the semiconductor device 400 may undergo further CMOS or MOS technology processing to form various features known in the art. In still another example, various contacts/vias and multilayer interconnect features (e.g., metal layers and interlayer dielectrics) may be formed on the substrate 410 and configured to connect the various features or structures of the semiconductor device 400.

Figure 5:
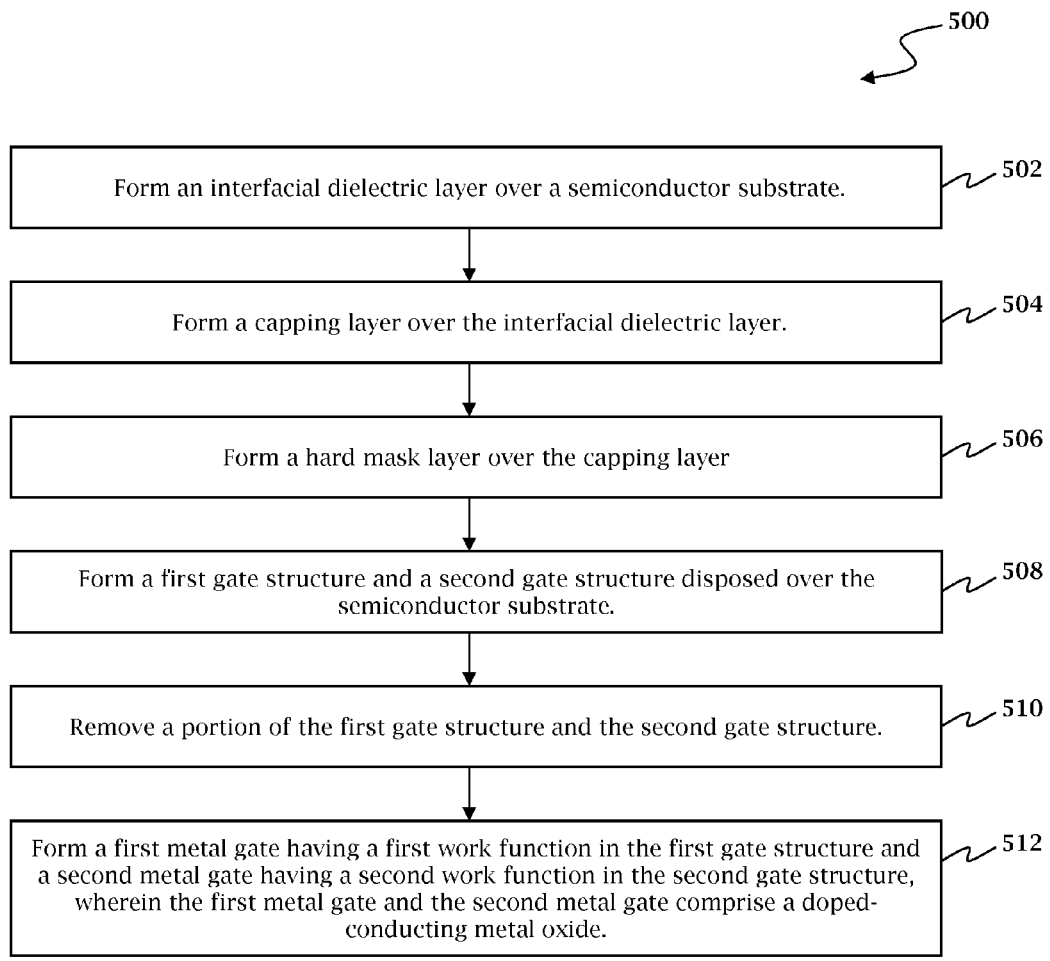
FIG. 5 is a flow chart of a method for forming a semiconductor device according to aspects of the present invention.
Figure 6A:
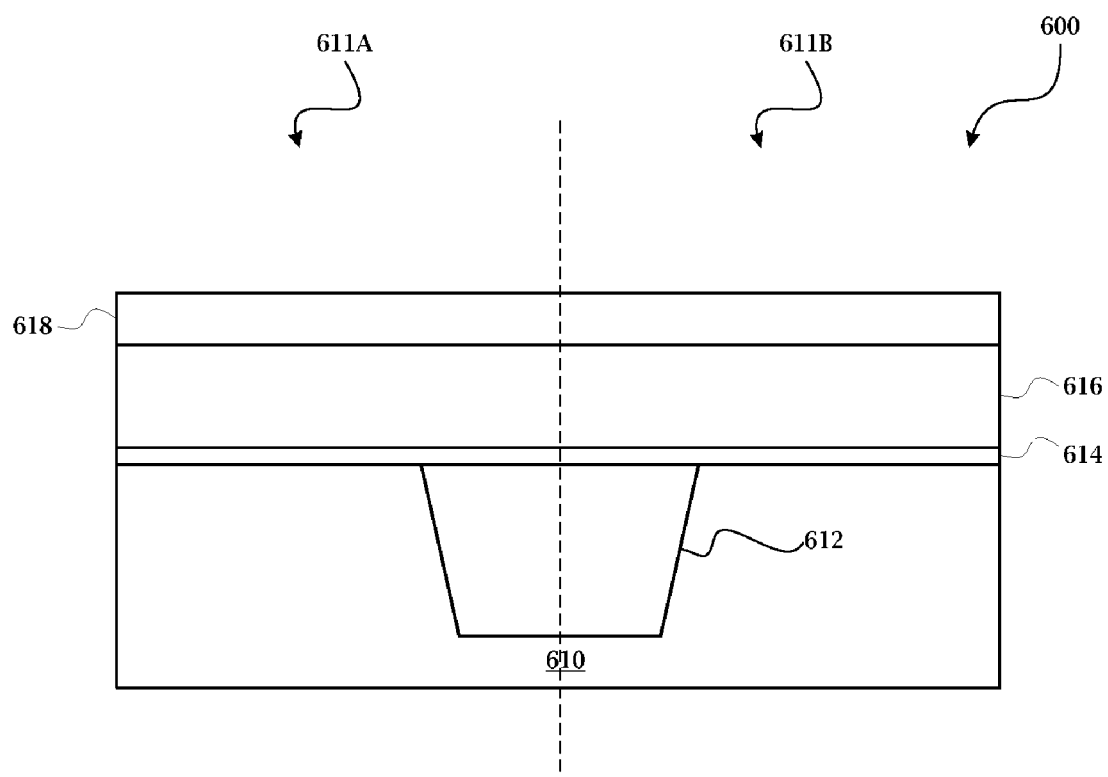
FIGS. 6A-6G are various cross-sectional views of embodiments of a semiconductor device during various fabrication stages according to the method of FIG. 5.

FIG. 5 is a flow chart of one embodiment of the method 500 for making the semiconductor device 600. FIGS. 6A-6G are various cross-sectional views of the semiconductor device 600 according to one embodiment, in portion or entirety, during various fabrication stages of the method 500. The method 500 provides for making the semiconductor device 600 in a gate-last process. Referring to FIGS. 5 and 6A, the method 500 begins at step 502 wherein a semiconductor substrate 610 including active regions 611A, 611B and at least one isolation region 612 is provided, and an interfacial dielectric layer 614 is formed over the semiconductor substrate 610.

The semiconductor substrate 610 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure. In the present embodiment, the semiconductor substrate 610 comprises silicon, germanium, group III-V materials, or group II-VI materials.

Semiconductor substrate 610 may include various doping configurations depending on design requirements as known in the art. In some embodiments, the semiconductor substrate 610 may include doped regions. The doped regions may be doped with p-type or n-type dopants. For example, the doped regions may be doped with p-type dopants, such as boron or $BF_2$; n-type dopants, such as phosphorus or arsenic; and/or combinations thereof. The doped regions may be formed directly on the semiconductor substrate, in a P-well structure, in a N-well structure, in a dual-well structure, or using a raised structure.

The semiconductor substrate 610 includes active regions 611A, 611B. In the present embodiment, the active region 611A may be configured for an NMOS, and the active region 611B may be configured for a PMOS. It is understood that the semiconductor device 600 may be formed by CMOS technology processing, and thus some processes are not described in detail herein.

The at least one isolation region 612 may be formed on the semiconductor substrate 610 to isolate active regions 611A, 611B of the semiconductor substrate 610, and in the present embodiment, to isolate the NMOS and PMOS transistor device regions. The isolation region 612 may utilize isolation technology, such as LOCOS or STI, to define and electrically isolate the various active regions 611A, 611B. In the present embodiment, the isolation region 612 includes a STI. The isolation region 612 may comprise silicon oxide, silicon nitride, silicon oxynitride, fluoride-doped silicate glass, a low-K dielectric material, other suitable materials, and/or combinations thereof. The isolation region 612, and in the present embodiment, the STI, may be formed by any suitable process.

The semiconductor device 600 may further include the interfacial dielectric layer 614 formed over the substrate 610. The interfacial dielectric layer 614 may be formed by any suitable process and any suitable thickness. For example, in the present embodiment, the interfacial dielectric layer 614 may include a grown $SiO_2$ layer having a thickness of approximately 4 Å. The interfacial layer 614 may further comprises SiON. In some embodiments, before the interfacial dielectric layer 614 is grown over the substrate 610, a HF-last pre-gate clean (e.g., utilizing an HF solution) and UV process may be performed. In some embodiments, the interfacial layer 614 may be formed by rapid thermal oxidation. Further, in some embodiments, the interfacial layer 614 may be omitted entirely.

The method 500 proceeds to step 504 where a capping layer 616 is formed over the interfacial dielectric layer 614. The capping layer 616 may comprise polycrystalline silicon; silicon-containing materials; germanium-containing materials; metal, such as aluminum, copper, tungsten, titanium, tantulum, titanium nitride, tantalum nitride, nickel silicide, cobalt silicide; other proper conductive materials; and/or combinations thereof. In the present embodiment, the capping layer 616 comprises polysilicon having a thickness between about 200 Å and about 1,000 Å, preferably about 600 Å. In some embodiments, the capping layer 616 may include metal (e.g., an aluminum-based, tungsten, or copper material), which may be used in a gate last-process and comprise a thickness between about 50 Å and about 1,000 Å, preferably about 200 Å. In alternate embodiments, the capping layer 616 may comprise any suitable thickness. The capping layer 616 may be formed by CVD, PVD, ALD, thermal oxide, plating, other suitable processes, and/or combinations thereof. In some embodiments, the capping layer 616 comprises aluminum and/or tungsten. In alternate embodiments, the capping layer 616 may comprise multilayer structures.

At step 506, a hard mask layer 618 is formed over the capping layer 616. In the present embodiment, the hard mask layer 618 comprises a nitrogen-containing material, such as silicon nitride, silicon oxynitride, other suitable nitrogen-containing materials, and/or combinations thereof. In alternate embodiments, the hard mask layer may include an amorphous carbon material, silicon carbide, other suitable dielectric materials, and/or combinations thereof. The hard mask layer 618 may be formed by any suitable process, such as PVD, CVD, PECVD, RTCVD, ALD, MOCVD, other suitable processes, and/or combinations thereof. The hard mask layer 618 may include a single layer or multiple layers. Further, the hard mask layer 618 comprises any suitable thickness. In the present embodiment, the hard mask layer 618 comprises a thickness of approximately 200 Å.

Figure 6B:
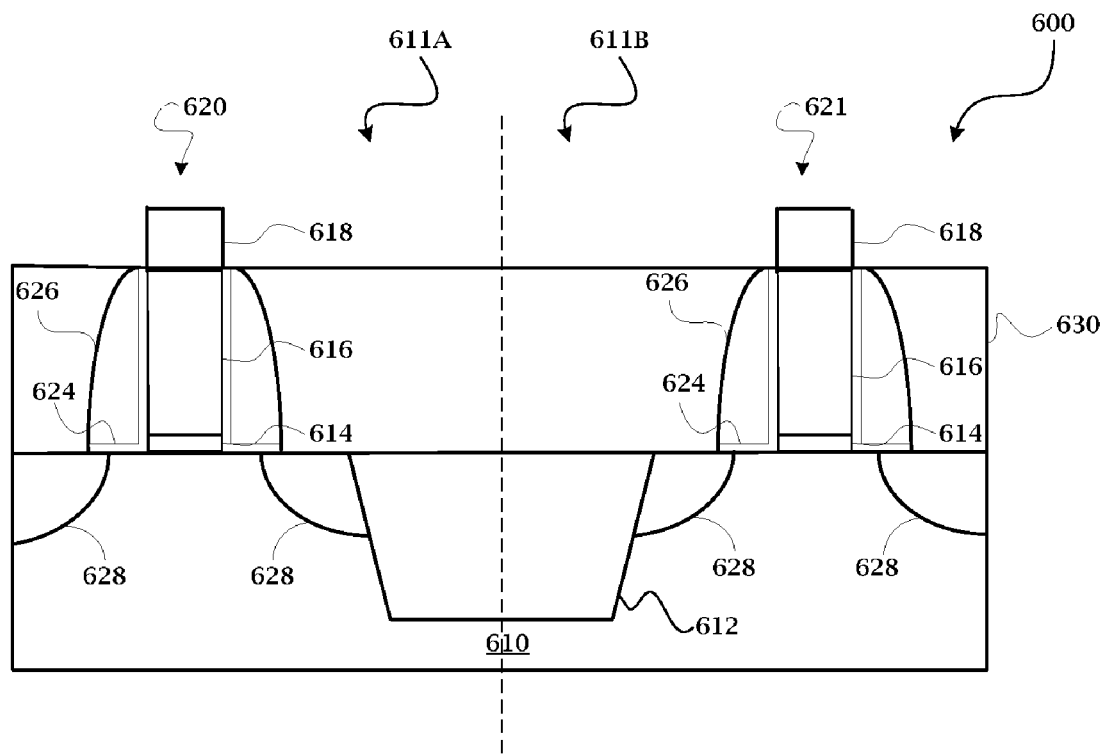

Referring to FIGS. 5 and 6B, at step 508, at least one gate structure is formed over the semiconductor substrate 610. In the present embodiment, a first gate structure 620 is formed within the active/NMOS region 611A, and a second gate structure 621 is formed within the active/PMOS region 611B. The gate structures 620, 621 include gate stacks having interfacial dielectric layer 614, capping layer 616, and hard mask layer 618; gate spacer liner 624; and gate spacers 626.

The first gate structure 620 and the second gate structure 621 may be formed by any suitable process. For example, the gate structures 620, 621 may be formed by conventional deposition, photolithography patterning, and etching processes, and/or combinations thereof. The deposition processes may include PVD, CVD, ALD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the gate structures 620, 621 may be formed by any combination of the processes described above.

In one example, for patterning the gate stacks of the gate structures 620, 621 having interfacial dielectric layer 614, capping layer 616, and hard mask layer 618, a layer of photoresist is formed over the hard mask layer 618 by a suitable process, such as spin-on coating, and then patterned to form a patterned photoresist feature by a proper lithography patterning method. The pattern of the photoresist can then be transferred by a dry etching process to the underlying layers (i.e., the interfacial dielectric layer 614, the capping layer 616, and the hard mask layer 618) to form the gate stacks as shown in FIG. 6B. The photoresist layer may be stripped thereafter. It is understood that the above examples do not limit the processing steps that may be utilized to form the metal gate stacks 620, 621.

The gate structures 620, 621 further include gate spacer liner 624 and gate spacers 626. The gate spacer liner 624 may comprise any suitable material and be formed by any suitable process. In the present embodiment, the gate spacer liner 624 comprises a spacer oxide. In alternate embodiments, the gate spacer liner 624 may be omitted entirely. Still, in other embodiments, the gate spacer liner 624 may comprise multiple layers.

The gate spacers 626, which are positioned on each side of the gate stacks of gate structures 620, 621 may comprise a dielectric material such as silicon nitride, silicon oxide, silicon carbide, silicon oxynitride, other suitable materials, or combinations thereof. In some embodiments, the gate spacers 626 may comprise a multilayer structure. The spacers 626 may be formed by depositing the dielectric material by CVD, ALD, PVD, and/or other suitable processes and then etching. In the present embodiment, the spacers 626 comprise silicon nitride.

The semiconductor device 600 may further comprise doped regions 628. Doped regions 628 may be formed in the substrate 610 located proximate to each end of the gate structures 620, 621 (high-k gate dielectric and metal gate electrode), respectively, and may comprise various doping profiles. The doped regions 628 may be doped heavily or lightly and n-type or p-type. In alternate embodiments, the doped regions may be formed directly on the semiconductor substrate, in a P-well structure, in a N-well structure, in a dual-well structure, or using a raised structure. The doped regions 628 are formed by any suitable process, such as ion implantation and/or a rapid thermal process to activate the doped regions. In some embodiments, the doped regions 628 may be formed by a plurality of ion implantation processes, such as LDD implant processes and S/D implant processes.

In some embodiments, a silicide may be formed in the doped regions 628. The silicide may also be formed in the gate structures 620, 621. The silicide may comprise materials such as NiSi, NiPtSi, NiPtGeSi, NiGeSi, YbSi, PtSi, IrSi, ErSi, CoSi, other suitable materials, and/or combinations thereof. The materials utilized to create the silicide may be deposited using PVD such as sputtering and evaporation; plating; CVD such as PECVD, APCVD, LPCVD, HDPCVD, and ALCVD; other suitable deposition processes; and/or combinations thereof. After deposition, the salicidation process may continue with a reaction between the deposited material and the doped regions at an elevated temperature that is selected based on the specific material or materials. This is also referred to as annealing, which may include a RTP. The reacted silicide may require a one step RTP or multiple step RTPs. In the present embodiment, the doped regions 628 include nickel silicide regions.

In the present embodiment, an interlevel dielectric layer (ILD) 630 is formed over the semiconductor device 600 by any suitable process, such as CVD, HDPCVD, spin-on, sputtering, other suitable methods, and/or combinations thereof. The ILD layer 630 may comprise any suitable material, such as silicon oxide, silicon oxynitride, low-k material, and/or other suitable materials. In one example, a CMP of the ILD 630 may be performed until the hard mask layer 618 is exposed as illustrated in FIG. 6B.

Figure 6C:
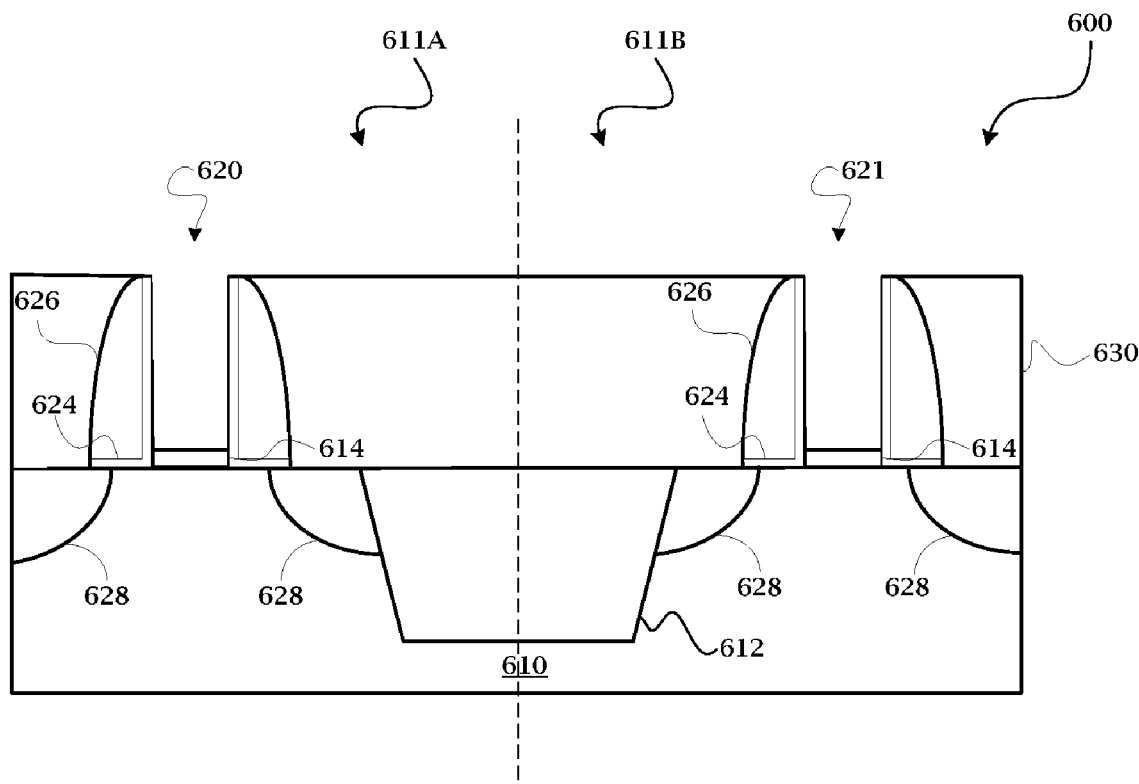

Referring to FIGS. 5 and 6C, at step 510, a portion of the first gate structure 620 and the second gate structure 621 is removed. The portion may be removed by any suitable process. In the present embodiment, the hard mask layer 618 and the capping layer 616 of gate structures 620, 621 are removed as illustrated in FIG. 6C. The hard mask layer 618 and capping layer 616 may be removed by any suitable process. For example, removing the hard mask layer 618 and capping layer 616 may include forming a photoresist layer over the semiconductor device 600; patterning the photoresist layer by a conventional photolithography process; and etching the photoresist layer to remove the hard mask layer 618 and capping layer 616. Subsequently, the photoresist layer may be removed. It is understood that the capping layer 616 and hard mask layer 618 may be removed from gate structures 620, 621 simultaneously or independently. It is further understood that, in some embodiments, the interfacial dielectric layer 614 may also be removed from the gate structures 620, 621 along with the capping layer 616 and the hard mask layer 618. The removed capping layer 616 and hard mask layer 618 (and in some embodiments, the removed interfacial dielectric layer 614) create an opening within each of the gate structures 620, 621.

Referring to FIGS. 5 and 6D-6G, at step 512, a first metal gate having a first work function is formed in the first gate structure 620, and a second metal gate having a second work function is formed in the second gate structure 621. In some embodiments, an interfacial dielectric layer may be formed over the substrate 610 and/or over the openings of the gate structures 620, 621. For example, if at step 510 or in previous processing, the interfacial dielectric layer 614 is removed from gate structures 620, 621, a second interfacial layer may be deposited over the substrate 610 and/or openings of the gate structures 620, 621. The interfacial dielectric layer (e.g., the second interfacial layer) may be formed by any suitable process and any suitable thickness. The interfacial layer may include a grown silicon oxide $SiO_2$ layer having a thickness of approximately 4 Å. The interfacial layer may further comprise SiON. In some embodiments, before the interfacial dielectric layer is grown over the substrate 610, a HF-last pre-gate clean (e.g., utilizing an HF solution) and UV process may be performed. In some embodiments, the interfacial layer may be formed by rapid thermal oxidation. Further, in some embodiments, the interfacial layer may be omitted entirely.

Figure 6D:
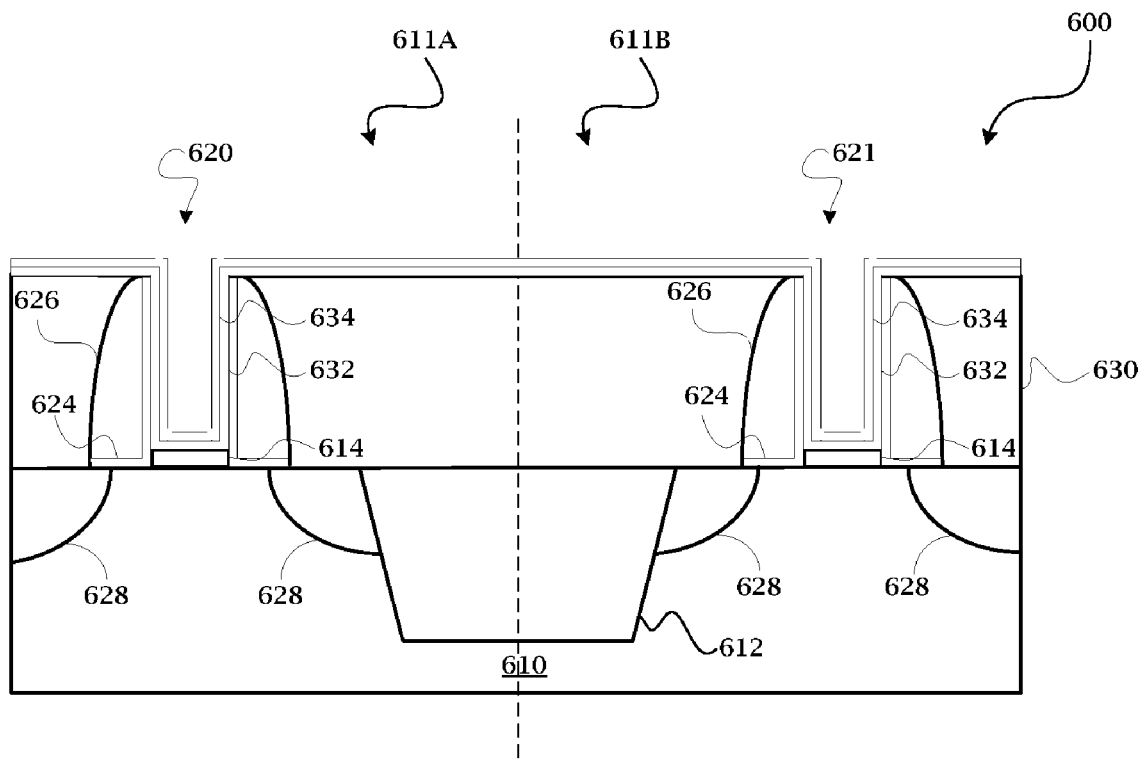

A high-k dielectric layer 632 is formed over semiconductor device 600, particularly the openings of the gate structure 620, 621 as shown in FIG. 6D. In the present embodiment, the high-k dielectric layer 632 is also formed over the interfacial dielectric layer 614. In some embodiments, if the interfacial dielectric layer 614 has been removed as discussed above, the high-k dielectric layer 632 may be formed over the second interfacial dielectric layer and/or other interfacial dielectric layer. The high-k dielectric layer 632 may include $HfO_2$. In the present embodiment, the high-k dielectric layer 632 includes hafnium oxide having a thickness of approximately 20 Å. Alternatively, the high-k dielectric layer 632 may optionally include other high-k dielectric materials such as HfSiO, HfSiON, HfTaO, HfTiO, HfZrO, other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof. The high-k dielectric layer 632 may be formed by any suitable process, such as ALD, CVD, PVD, RPCVD, PECVD, MOCVD, sputtering, plating, other suitable processes, and/or combinations thereof.

In some embodiments, a diffusion barrier/protection layer 634 is formed over the high-k dielectric layer 634. The diffusion barrier/protection layer 634 may comprise titanium, titanium nitride, tantalum, tantalum nitride, other suitable material, and/or combinations thereof. In the present embodiment, the diffusion barrier layer 634 comprises TiN, which is deposited by PVD to a thickness of approximately 20 Å. In alternate embodiments, the diffusion barrier/protection layer may be formed by any suitable process, such as CVD, PVD, ALD, thermal oxide, plating, and/or combinations thereof. Further, in alternate embodiments, the diffusion barrier/protection layer 634 comprises any suitable thickness. It is understood that the diffusion barrier/protection layer 634 may be omitted for alternate embodiments.

Figure 6E:
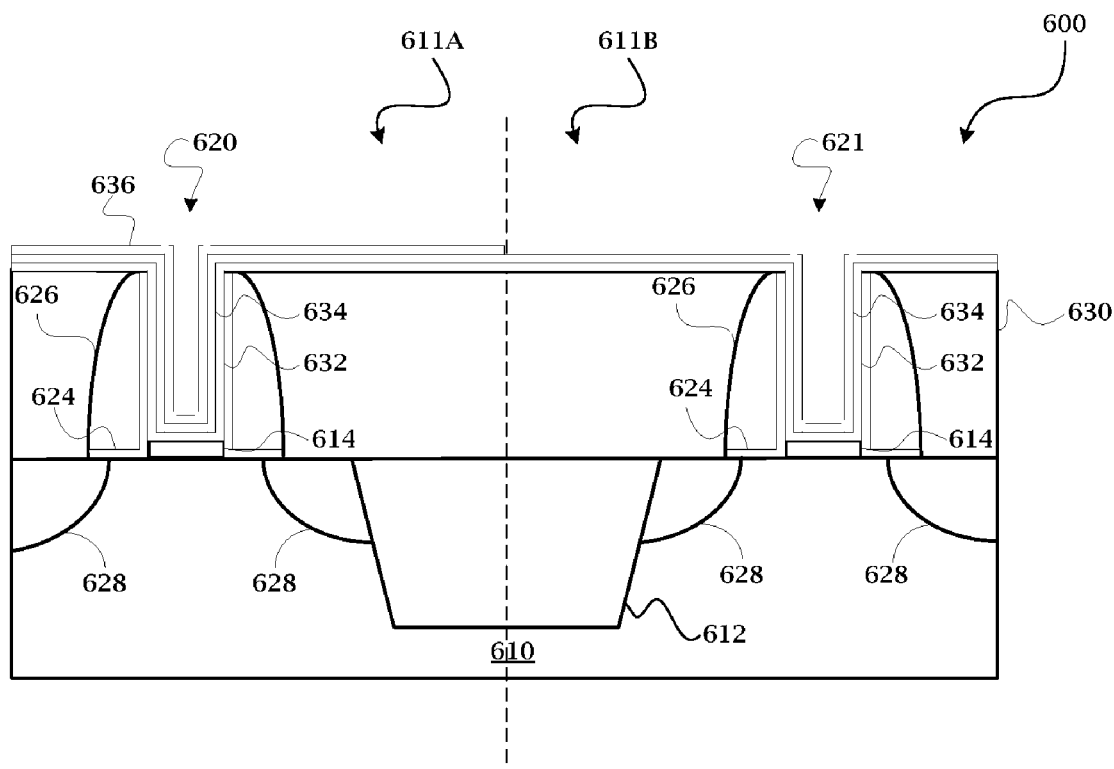
Figure 6F:
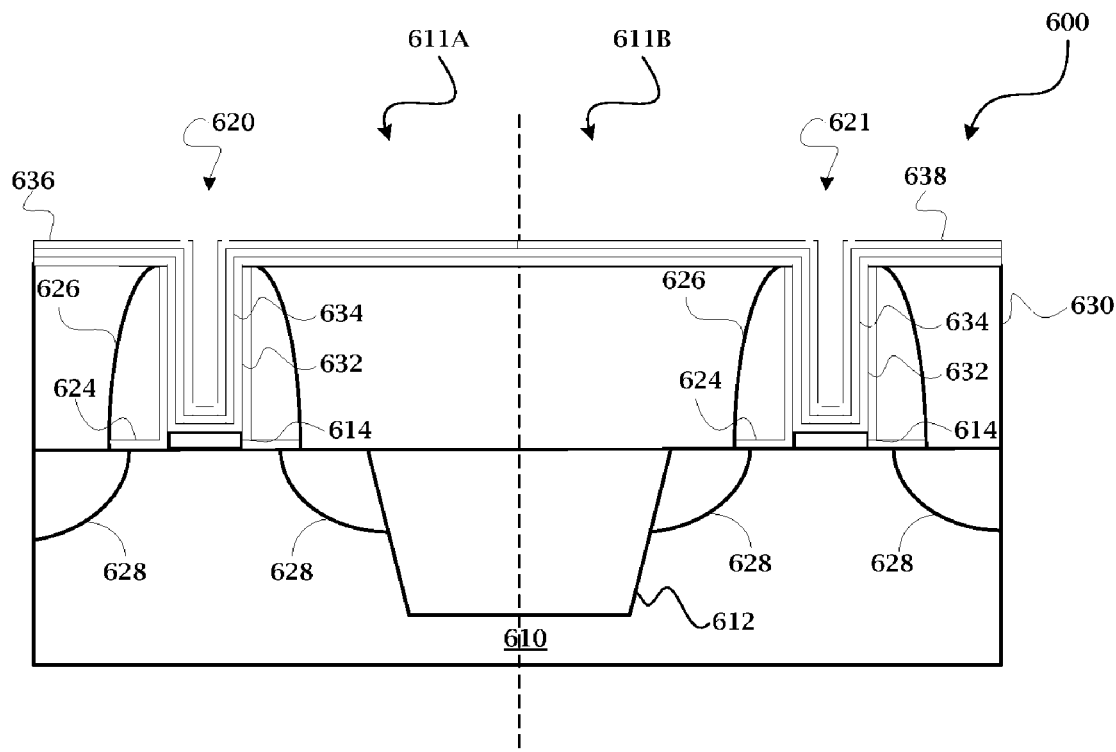

Referring to FIG. 6E, the first metal gate having the first work function is formed in the first gate structure 620 by forming a first metal layer 636 over the semiconductor device 600 in the active/NMOS region 611A. In the present embodiment, the first metal layer 636 is formed over the diffusion barrier/protection layer 634. Referring to FIG. 6F, the second metal gate having the second work function is formed in the second gate structure 621 by forming a second metal layer 638 over the semiconductor device 600 in the active/PMOS region 611B. In the present embodiment, the second metal layer 638 is formed over the diffusion barrier/protection layer 634.

The present embodiment provides first metal layer 636 and second metal layer 638 with correct work function values and better thermal stability. Such improved work function values and thermal stability is achieved by the metal layers 636, 638 comprising a DCO. The DCO may comprise $SnO_2$, $In_2O_3$, ZnO, CdO, and/or combinations thereof; $SnO_2$ doped with Sb, F, As, Nb, Ta, and/or combinations thereof; $In_2O_3$ doped with Zn, Ge, Mo, F, Ti, Zr, Hf, Nb, Ta, W, Te, Ga, Mg, Sn, and/or combinations thereof; ZnO doped with Al, Ga, B, In, Y, Sc, F, V, Si, Ge, Ti, Zr, Hf, and/or combinations thereof; CdO doped with In, Sn, and/or combinations thereof; $CdSb_2O_6$ doped with Y; other suitable materials; and/or combinations thereof (e.g., ZnO doped with $SnO_2$; ZnO doped with $In_2O_3$, ZnO doped with $In_2O_3$ doped with $SnO_2$). The DCO may comprise a TCO, which may include $SnO_2$, $In_2O_3$, ZnO, CdO, and/or combinations thereof. Further, Table 1 above provides DCOs that are well-suited for obtaining desirable p-type work functions, n-type work functions, and mid-gap work functions. Accordingly, utilizing DCO materials for metal layers 636, 638 provides optimal tuning of the work functions of the varying compositions of metal layers. In the present embodiment, the first metal layer 636 having the first work function in the active/NMOS region 611A comprises a n-type work function material, AZO, which includes ZnO doped with Al; and the second metal layer 638 having the second work function in the active/PMOS region 611B comprises a p-type work function material, ZZO, which includes ZnO doped with Zr. In some embodiments, the first metal layer 636 and the second metal layer 638 may each have a thickness between about 20 Å and about 1,000 Å. In some embodiments, the first metal layer 636 and the second metal layer 638 comprise a thickness about 200 Å. In some embodiments, the metal layers 636, 638 may both comprise a p-type work function material, wherein each metal layer comprises a similar or different work function value. In alternate embodiments, the metal layers 636, 638 may both comprise an n-type work function material or a mid-gap work function material, wherein each metal layer comprises material with similar or different work function values.

The metal layers 636, 638 may be formed by any suitable process. For example, the metal layers 636, 638 may be formed by conventional deposition, photolithography patterning, and etching processes, and/or combinations thereof. The deposition processes may include PVD, CVD, ALD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the metal layers 636, 638 may be formed by any combination of the processes described above.

Figure 6G:
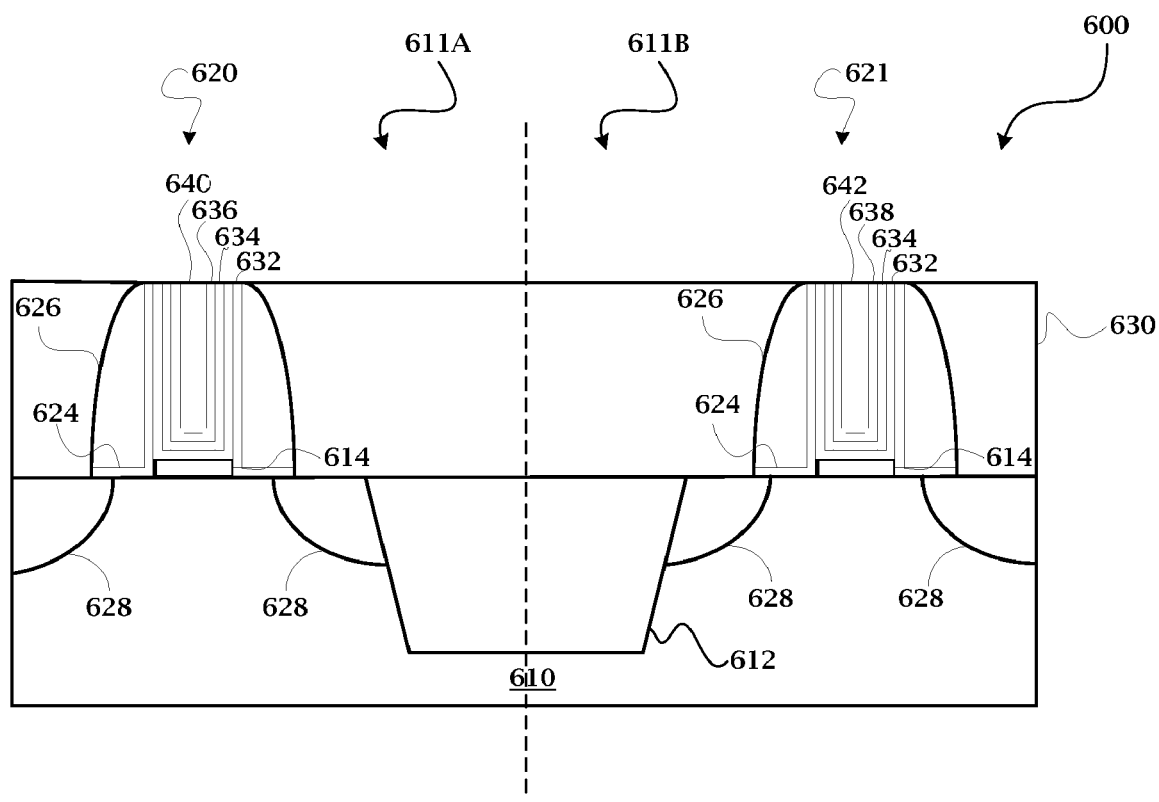

Bulk metal regions 640, 642 are formed over the metal layers 636, 638 as shown in FIG. 6G. The bulk metal regions 640, 642 may be formed by any suitable processes, such as deposition, photolithography, and etching processes, and/or combinations thereof. In the present embodiment, the bulk metal regions 640, 642 comprise aluminum deposited by CVD, followed by a CMP. In alternate embodiments, the bulk metal regions 640, 642 may comprise any suitable material, such as copper, tungsten, titanium, tantulum, titanium nitride, tantalum nitride, nickel silicide, cobalt silicide; other proper conductive materials; and combinations thereof. Further, in some embodiments, the bulk metal regions 640, 642 may comprise different materials. It is understood that the semiconductor device 600 may undergo further CMOS or MOS technology processing to form various features known in the art. In still another example, various contacts/vias and multilayer interconnect features (e.g., metal layers and interlayer dielectrics) may be formed on the substrate 610 and configured to connect the various features or structures of the semiconductor device 600.

Figure 7:
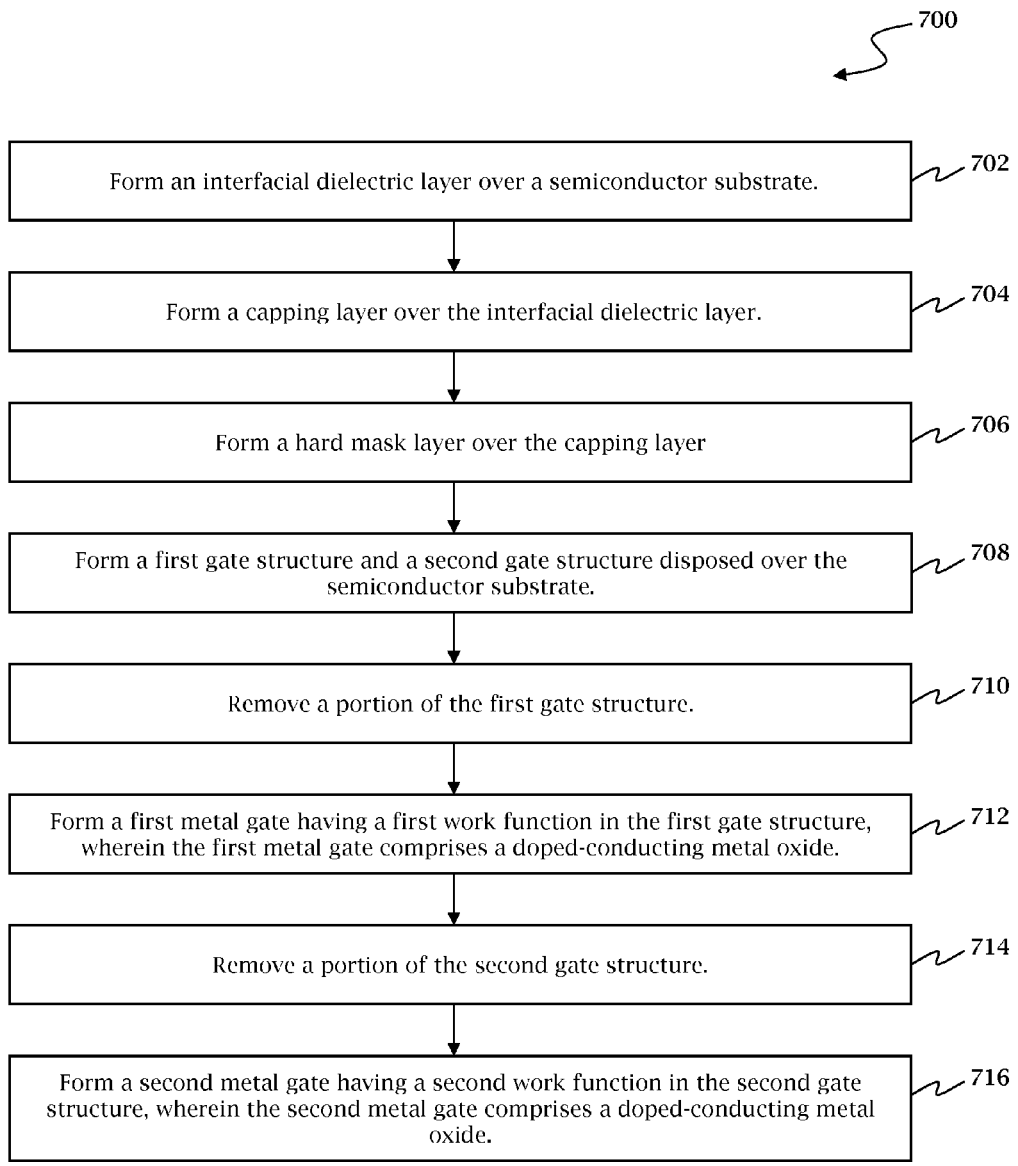
FIG. 7 is a flow chart of a method for forming a semiconductor device according to aspects of the present invention.
Figure 8A:
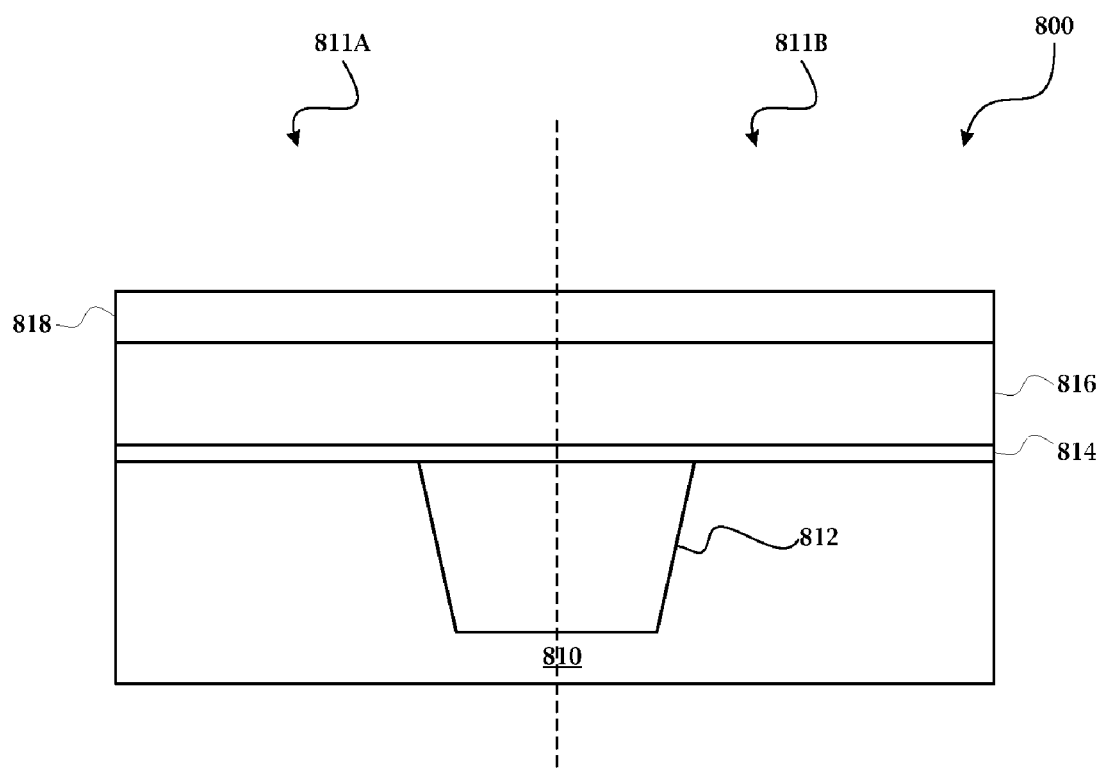
FIGS. 8A-8D are various cross-sectional views of embodiments of a semiconductor device during various fabrication stages according to the method of FIG. 7.

FIG. 7 is a flow chart of one embodiment of the method 700 for making the semiconductor device 800. FIGS. 8A-8D are various cross-sectional views of the semiconductor device 800 according to one embodiment, in portion or entirety, during various fabrication stages of the method 700. The method 700 provides for making the semiconductor device 800 in a gate-last process. Referring to FIGS. 7 and 8A, the method 700 begins at step 702 wherein a semiconductor substrate 810 including active regions 811A, 811B and at least one isolation region 812 is provided, and an interfacial dielectric layer 814 is formed over the semiconductor substrate 810.

The semiconductor substrate 810 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure. In the present embodiment, the semiconductor substrate 810 comprises silicon, germanium, a group III-V material, or a group II-VI material.

Semiconductor substrate 810 may include various doping configurations depending on design requirements as known in the art. In some embodiments, the semiconductor substrate 810 may include doped regions. The doped regions may be doped with p-type or n-type dopants. For example, the doped regions may be doped with p-type dopants, such as boron or $BF_2$; n-type dopants, such as phosphorus or arsenic; and/or combinations thereof. The doped regions may be formed directly on the semiconductor substrate, in a P-well structure, in a N-well structure, in a dual-well structure, or using a raised structure.

The semiconductor substrate 810 includes active regions 811A, 811B. In the present embodiment, the active region 811A may be configured for an NMOS, and the active region 811B may be configured for a PMOS. It is understood that the semiconductor device 800 may be formed by CMOS technology processing, and thus some processes are not described in detail herein.

The at least one isolation region 812 may be formed on the semiconductor substrate 810 to isolate active regions 811A, 811B of the semiconductor substrate 810, and in the present embodiment, to isolate the NMOS and PMOS transistor device regions. The isolation region 812 may utilize isolation technology, such as LOCOS or STI, to define and electrically isolate the various active regions 811A, 811B. In the present embodiment, the isolation region 812 includes a STI. The isolation region 812 may comprise silicon oxide, silicon nitride, silicon oxynitride, fluoride-doped silicate glass, a low-K dielectric material, other suitable materials, and/or combinations thereof. The isolation region 812, and in the present embodiment, the STI, may be formed by any suitable process.

The semiconductor device 800 further includes the interfacial dielectric layer 814 formed over the substrate 810. The interfacial dielectric layer 814 may be formed by any suitable process and any suitable thickness. For example, in the present embodiment, the interfacial dielectric layer 814 may include a grown $SiO_2$ layer having a thickness of approximately 4 Å. The interfacial layer 814 may further comprise SiON. In some embodiments, before the interfacial dielectric layer 814 is grown over the substrate 810, a HF-last pre-gate clean (e.g., utilizing an HF solution) and UV process may be performed. In some embodiments, the interfacial layer 814 may be formed by rapid thermal oxidation. Further, in some embodiments, the interfacial layer 814 may be omitted entirely.

The method 700 proceeds to step 704 where a capping layer 816 is formed over the interfacial dielectric layer 814. The capping layer 816 may comprise polycrystalline silicon; silicon-containing materials; germanium-containing materials; metal, such as aluminum, copper, tungsten, titanium, tantulum, titanium nitride, tantalum nitride, nickel silicide, cobalt silicide; other proper conductive materials; and combinations thereof. In the present embodiment, the capping layer 816 comprises polysilicon having a thickness between about 200 Å and about 1,000 Å, preferably about 600 Å. In some embodiments, the capping layer 816 may include metal (e.g., an aluminum-based, tungsten, or copper material), which may be used in a gate last-process and comprise a thickness between about 50 Å and about 1,000 Å, preferably about 200 Å. In alternate embodiments, the capping layer 816 may comprise any suitable thickness. The capping layer 816 may be formed by CVD, PVD, ALD, thermal oxide, plating, other suitable processes, and/or combinations thereof. In some embodiments, the capping layer 816 comprises aluminum and/or tungsten. In alternate embodiments, the capping layer 816 may comprise multilayer structures.

At step 706, a hard mask layer 818 is formed over the capping layer 816. In the present embodiment, the hard mask layer 818 comprises a nitrogen-containing material, such as silicon nitride, silicon oxynitride, other suitable nitrogen-containing materials, and/or combinations thereof. In alternate embodiments, the hard mask layer may include an amorphous carbon material, silicon carbide, other suitable dielectric materials, and/or combinations thereof. The hard mask layer 818 may be formed by any suitable process, such as PVD, CVD, PECVD, RTCVD, ALD, MOCVD, other suitable processes, and/or combinations thereof. The hard mask layer 818 may include a single layer or multiple layers. Further, the hard mask layer 818 comprise any suitable thickness. In the present embodiment, the hard mask layer 818 comprises a thickness of approximately 200 Å.

Figure 8B:
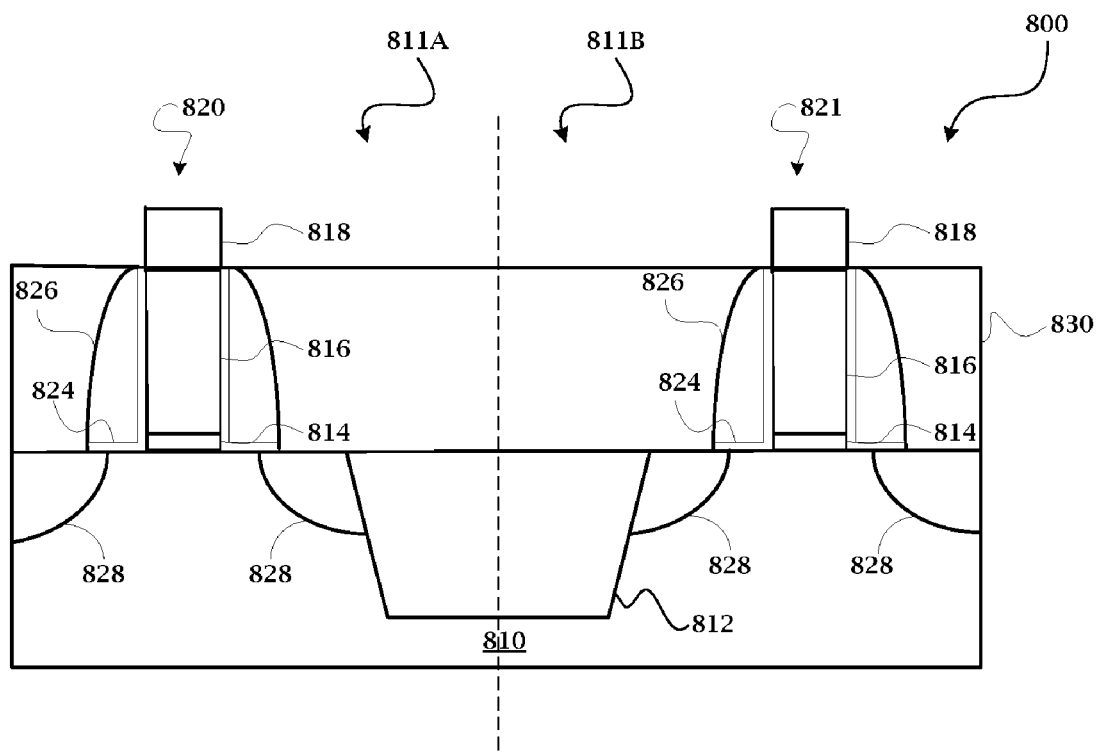

Referring to FIGS. 7 and 8B, at step 708, at least one gate structure is formed over the semiconductor substrate 810. In the present embodiment, a first gate structure 820 is formed within the active/NMOS region 811A, and a second gate structure 821 is formed within the active/PMOS region 811B. The gate structures 820, 821 include gate stacks having interfacial dielectric layer 814, capping layer 816, and hard mask layer 818; gate spacer liner 824; and gate spacers 826.

The first gate structure 820 and the second gate structure 821 may be formed by any suitable process. For example, the gate structures 820, 821 may be formed by conventional deposition, photolithography patterning, and etching processes, and/or combinations thereof. The deposition processes may include PVD, CVD, ALD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the gate structures 820, 821 may be formed by any combination of the processes described above.

In one example, for patterning the gate stacks of the gate structures 820, 821 having interfacial dielectric layer 814, capping layer 816, and hard mask layer 818, a layer of photoresist is formed over the hard mask layer 818 by a suitable process, such as spin-on coating, and then patterned to form a patterned photoresist feature by a proper lithography patterning method. The pattern of the photoresist can then be transferred by a dry etching process to the underlying layers (i.e., the interfacial dielectric layer 814, the capping layer 816, and the hard mask layer 818) to form the gate stacks as shown in FIG. 8B. The photoresist layer may be stripped thereafter. It is understood that the above examples do not limit the processing steps that may be utilized to form the metal gate stacks 820, 821.

The gate structures 820, 821 further include gate spacer liner 824 and gate spacers 826. The gate spacer liner 824 may comprise any suitable material and be formed by any suitable process. In the present embodiment, the gate spacer liner 824 comprises a spacer oxide. In alternate embodiments, the gate spacer liner 824 may be omitted entirely. Still, in other embodiments, the gate spacer liner 824 may comprise multiple layers.

The gate spacers 826, which are positioned on each side of the gate stacks of gate structures 820, 821 may comprise a dielectric material such as silicon nitride, silicon oxide, silicon carbide, silicon oxynitride, other suitable materials, or combinations thereof. In some embodiments, the gate spacers 826 may comprise a multilayer structure. The spacers 826 may be formed by depositing the dielectric material by CVD, ALD, PVD, and/or other suitable processes and then etching. In the present embodiment, the spacers 826 comprise silicon nitride.

The semiconductor device 800 may further comprise doped regions 828. Doped regions 828 may be formed in the substrate 810 located proximate to each end of the gate structures 820, 821 (high-k gate dielectric and metal gate electrode), respectively, and may comprise various doping profiles. The doped regions 828 may be doped heavily or lightly and n-type or p-type. In alternate embodiments, the doped regions may be formed directly on the semiconductor substrate, in a P-well structure, in a N-well structure, in a dual-well structure, or using a raised structure. The doped regions 828 are formed by any suitable process, such as ion implantation and/or a rapid thermal process to activate the doped regions. In some embodiments, the doped regions 828 may be formed by a plurality of ion implantation processes, such as LDD implant processes and S/D implant processes.

In some embodiments, a silicide may be formed in the doped regions 828. The silicide may also be formed in the gate structures 820, 821. The silicide may comprise materials such as NiSi, NiPtSi, NiPtGeSi, NiGeSi, YbSi, PtSi, IrSi, ErSi, CoSi, other suitable materials, and/or combinations thereof. The materials utilized to create the silicide may be deposited using PVD such as sputtering and evaporation; plating; CVD such as PECVD, APCVD, LPCVD, HDPCVD, and ALCVD; other suitable deposition processes; and/or combinations thereof. After deposition, the salicidation process may continue with a reaction between the deposited material and the doped regions at an elevated temperature that is selected based on the specific material or materials. This is also referred to as annealing, which may include a RTP. The reacted silicide may require a one step RTP or multiple step RTPs. In the present embodiment, the doped regions 828 include nickel silicide regions.

In the present embodiment, an interlevel dielectric layer (ILD) 830 is formed over the semiconductor device 800 by any suitable process, such as CVD, HDPCVD, spin-on, sputtering, other suitable methods, and/or combinations thereof. The ILD layer 830 may comprise any suitable material, such as silicon oxide, silicon oxynitride, low-k material, and/or other suitable materials. In one example, a CMP of the ILD 830 may be performed until the hard mask layer 818 is exposed as illustrated in FIG. 8B.

Figure 8C:
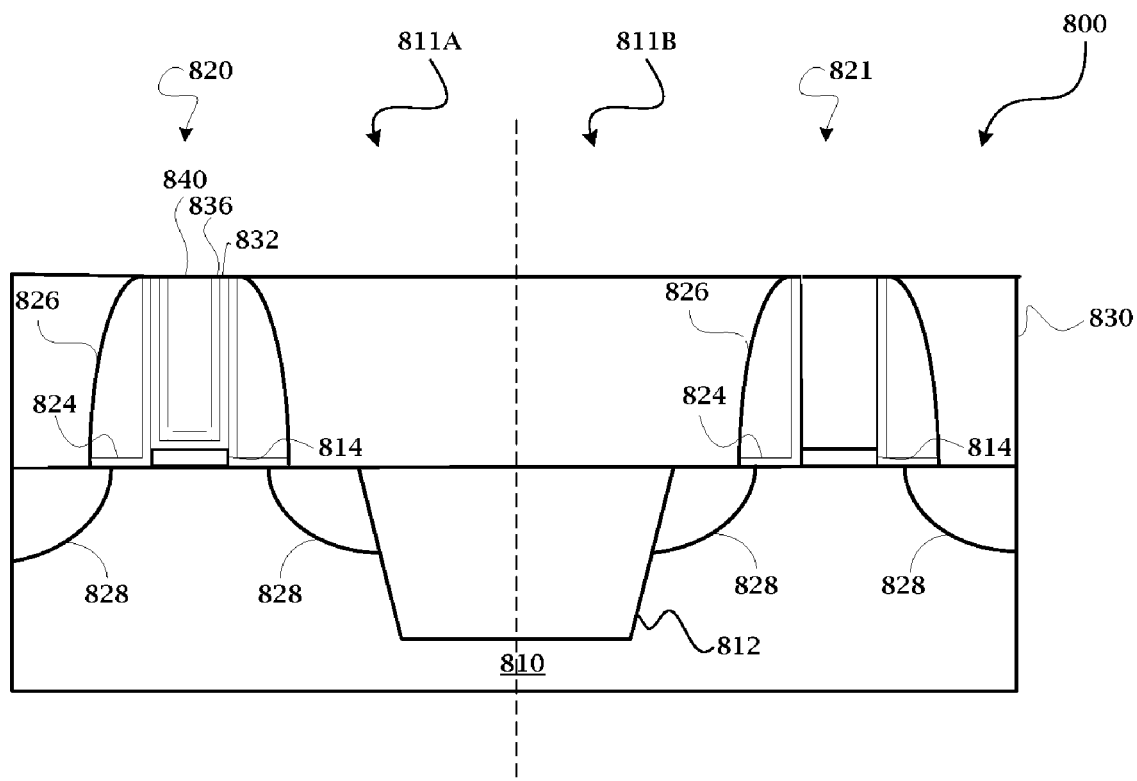
Figure 8D:
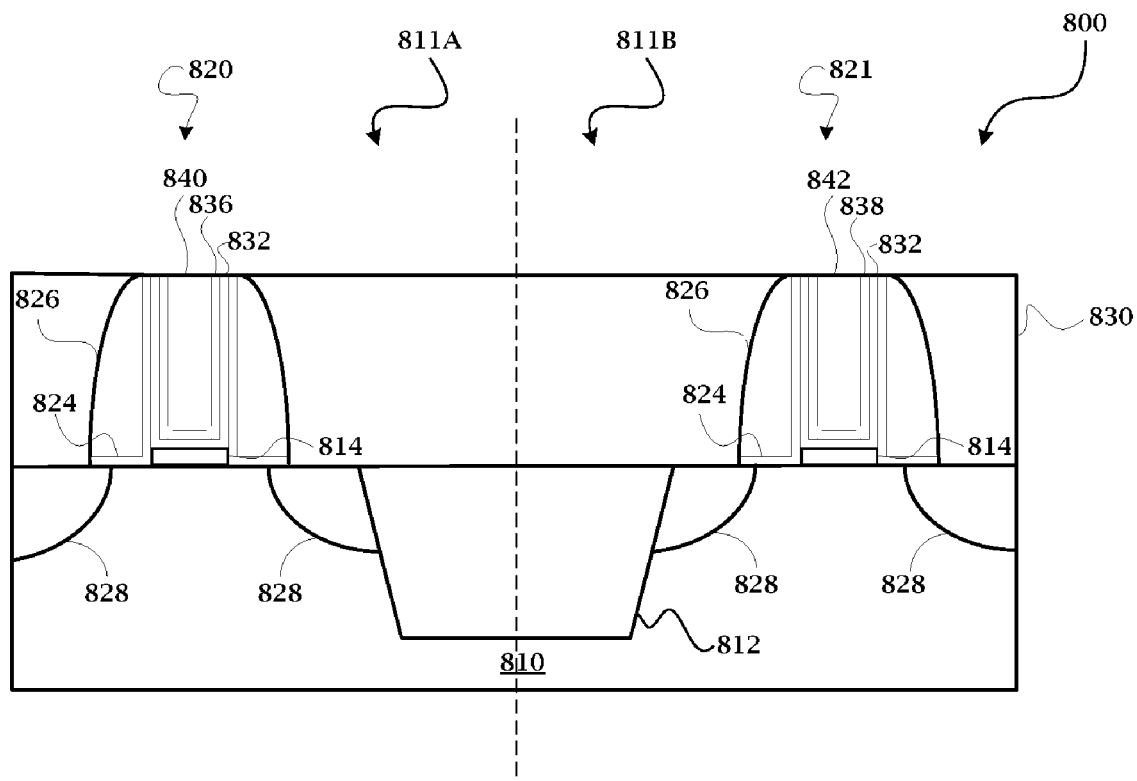

Referring to FIGS. 7 and 8C-8D, at step 710, a portion of the first gate structure 820 is removed; at step 712, a first metal gate having a first work function is formed in the first gate structure 820; at step 714, a portion of the second gate structure 821 is removed; and at step 716, a second metal gate having a second work function is formed in the second gate structure 821. In the present embodiment, the first metal gate of the first gate structure 820 and the second metal gate of the second gate structure 821 are separately formed and processed. For simplicity, the processes used to form the first metal gate and the second metal gate are discussed together.

Removing the portions of the first gate structure 820 and the second gate structure 821, in steps 710 and 714, may be accomplished by any suitable process. In the present embodiment, the hard mask layer 818 and the capping layer 816 of gate structures 820, 821 is removed by any suitable process. For example, removing the hard mask layer 818 and capping layer 816 may include forming a photoresist layer over the semiconductor device 800; patterning the photoresist layer by a conventional photolithography process; and etching the photoresist layer to remove the hard mask layer 818 and capping layer 816. Subsequently, the photoresist layer may be removed. It is understood that, in some embodiments, the interfacial dielectric layer 814 may also be removed from the gate structures 820, 821 along with the capping layer 816 and the hard mask layer 818. The removed capping layer 816 and hard mask layer 818 (and in some embodiments, the removed interfacial dielectric layer 814) create an opening within each of the gate structures 820, 821.

In steps 712 and 716, the first metal gate having a first work function in the first gate structure 820 and the second metal gate having a second work function in the second gate structure 821 may be formed by any suitable process. In some embodiments, an interfacial dielectric layer may be formed over the substrate 810 and/or over the openings of the gate structures 820, 821. For example, if at step 710, 714, or in previous processing, the interfacial dielectric layer 814 is removed from gate structures 820, 821, a second interfacial layer may be deposited over the substrate 810 and/or openings of the gate structures 820, 821. The interfacial dielectric layer (e.g., the second interfacial dielectric layer) may be formed by any suitable process and any suitable thickness. For example, in the present embodiment, the interfacial layer may include a grown silicon oxide $SiO_2$ layer having a thickness of approximately 4 Å. The interfacial layer may further comprise SiON. In some embodiments, before the interfacial dielectric layer is grown over the substrate 810, a HF-last pre-gate clean (e.g., utilizing an HF solution) and UV process may be performed. In some embodiments, the interfacial layer may be formed by rapid thermal oxidation. Further, in some embodiments, the interfacial layer may be omitted entirely.

A high-k dielectric layer 832 is formed over semiconductor device 800, particularly the openings of the gate structures 820, 821 as shown in FIGS. 8C, 8D. In the present embodiment, the high-k dielectric layer 832 is also formed over the interfacial dielectric layer 814. In some embodiments, if the interfacial dielectric layer 814 has been removed as discussed above, the high-k dielectric layer 832 may be formed over the second interfacial dielectric layer and/or other interfacial dielectric layer. The high-k dielectric layer 832 may include $HfO_2$. In the present embodiment, the high-k dielectric layer 832 includes hafnium oxide having a thickness of approximately 20 Å. Alternatively, the high-k dielectric layer 832 may optionally include other high-k dielectric materials such as HfSiO, HfSiON, HfTaO, HfTiO, HfZrO, other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof. The high-k dielectric layer 832 may be formed by any suitable process, such as ALD, CVD, PVD, RPCVD, PECVD, MOCVD, sputtering, plating, other suitable processes, and/or combinations thereof. In some embodiments, a diffusion barrier/protection layer may be formed over the high-k dielectric layer 832, similar to the diffusion barrier/protection layers discussed above.

Referring to FIG. 8C, the first metal gate having the first work function is formed in the first gate structure 820 by forming a first metal layer 836 over the semiconductor device 800 in the active/NMOS region 811A. In the present embodiment, the first metal layer 836 is formed over the high-k dielectric layer 832. Referring to FIG. 8D, the second metal gate having the second work function is formed in the second gate structure 821 by forming a second metal layer 838 over the semiconductor device 800 in the active/PMOS region 811B. In the present embodiment, the second metal layer 838 is formed over the high-k dielectric layer 832.

The present embodiment provides first metal layer 836 and second metal layer 838 with correct work function values and better thermal stability. Such improved work function values and thermal stability is achieved by the metal layers 836, 838 comprising a DCO. The DCO may comprise $SnO_2$, $In_2O_3$, ZnO, CdO, and/or combinations thereof; $SnO_2$ doped with Sb, F, As, Nb, Ta, and/or combinations thereof; $In_2O_3$ doped with Zn, Ge, Mo, F, Ti, Zr, Hf, Nb, Ta, W, Te, Ga, Mg, Sn, and/or combinations thereof; ZnO doped with Al, Ga, B, In, Y, Sc, F, V, Si, Ge, Ti, Zr, Hf, and/or combinations thereof; CdO doped with In, Sn, and/or combinations thereof; $CdSb_2O_6$ doped with Y; other suitable materials; and/or combinations thereof (e.g., ZnO doped with $SnO_2$; ZnO doped with $In_2O_3$, ZnO doped with $In_2O_3$ doped with $SnO_2$). The DCO may comprise a TCO, which may include $SnO_2$, $In_2O_3$, ZnO, CdO, and/or combinations thereof. Further, Table 1 above provides DCOs that are well-suited for obtaining desirable p-type work functions, n-type work functions, and mid-gap work functions. Accordingly, utilizing DCO materials for metal layers 836, 838 provides optimal tuning of the work functions of the varying compositions of metal layers. In the present embodiment, the first metal layer 836 having the first work function in the active/NMOS region 811A comprises a n-type work function material, AZO, which includes ZnO doped with Al; and the second metal layer 838 having the second work function in the active/PMOS region 811B comprises a p-type work function material, ZZO, which includes ZnO doped with Zr. In some embodiments, the first metal layer 836 and the second metal layer 838 may each have a thickness between about 20 Å and about 1,000 Å. In some embodiments, the first metal layer 836 and the second metal layer 838 comprise a thickness of about 200 Å. In some embodiments, the metal layers 836, 838 may both comprise a p-type work function material, wherein each metal layer comprises a similar or different work function value. In alternate embodiments, the metal layers 836, 838 may both comprise an n-type work function material or a mid-gap work function material, wherein each metal layer comprises material with similar or different work function values.

The metal layers 836, 838 may be formed by any suitable process. For example, the metal layers 836, 838 may be formed by conventional deposition, photolithography patterning, and etching processes, and/or combinations thereof. The deposition processes may include PVD, CVD, ALD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the metal layers 836, 838 may be formed by any combination of the processes described above.

Bulk metal regions 840, 842 are formed over the metal layers 836, 838. The bulk metal regions 840, 842 may be formed by any suitable processes, such as deposition, photolithography, and etching processes, and/or combinations thereof. In the present embodiment, the bulk metal regions 840, 842 comprise aluminum deposited by CVD, followed by a CMP. In alternate embodiments, the bulk metal regions 840, 842 may comprise any suitable material, such as copper, tungsten, titanium, tantulum, titanium nitride, tantalum nitride, nickel silicide, cobalt silicide; other proper conductive materials; and combinations thereof. Further, in some embodiments, the bulk metal regions 840, 842 may comprise different materials. It is understood that the semiconductor device 800 may undergo further CMOS or MOS technology processing to form various features known in the art. In still another example, various contacts/vias and multilayer interconnect features (e.g., metal layers and interlayer dielectrics) may be formed on the substrate 810 and configured to connect the various features or structures of the semiconductor device 800.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
providing a semiconductor substrate having a first and second region;
forming an interfacial dielectric layer over the semiconductor substrate;
forming a high-k dielectric layer over the interfacial dielectric layer;

forming a first doped-conducting metal oxide layer over the high-k dielectric layer in the first region;

forming a second doped-conducting metal oxide layer over the high-k dielectric layer in the second region;

forming a capping layer over the first doped-conducting metal oxide layer and the second doped-conducting metal oxide layer;

patterning and etching the capping layer, the second doped-conducting metal oxide layer, the first doped-conducting metal oxide layer, the high-k dielectric layer, and the interfacial layer, wherein the patterning and etching forms a first gate stack in the first region and a second gate stack in the second region, the first gate stack including the interfacial layer, the high-k dielectric layer, the first doped-conducting metal oxide layer, and the capping layer, and the second gate stack including the interfacial layer, the high-k dielectric layer, the second doped-conducting metal oxide layer, and the capping layer.

2. The method of claim 1 wherein
the forming the first doped-conducting metal oxide layer includes forming a transparent conducting oxide layer doped with a first dopant; and
the forming the second doped-conducting metal oxide layer includes forming the transparent conducting oxide layer doped with a second dopant.

3. The method of claim 1, wherein the capping layer comprises aluminum, tungsten, or polysilicon.

4. A method comprising:
providing a semiconductor substrate having a first and second region;
forming an interfacial dielectric layer over the semiconductor substrate;
forming a high-k gate dielectric layer over the interfacial dielectric layer;
forming a first doped-conducting metal oxide layer over the high-k gate dielectric layer in the first region;
forming a second doped-conducting metal oxide layer over the high-k dielectric layer in the second region;
forming a capping layer over the first doped-conducting metal oxide layer and the second doped-conducting metal oxide layer;
forming a first gate stack in the first region, the first gate stack including the interfacial layer, the high-k dielectric layer, the first doped-conducting metal oxide layer, and the capping layer; and the second gate stack including the interfacial layer, the high-k dielectric layer, the second doped-conducting metal oxide layer, and the capping layer; and
forming a diffusion barrier layer between the high-k gate dielectric layer and the first and second doped-conducting metal oxide layers.

5. The method of claim 4 further comprising forming a diffusion barrier layer between the first and second doped-conducting metal oxide layers and the capping layer.

6. The method of claim 1, wherein the first and second doped-conducting metal oxide layers comprises one of $SnO_2$; $In_2O_3$; ZnO; CdO; $SnO_2$ doped with Sb, F, As, Nb, and/or Ta; $In_2O_3$ doped with Zn, Ge, Mo, F, Ti, Zr, Hf, Nb, Ta, W, Te, Ga, and/or Mg; ZnO doped with Al, Ga, B, In, Y, Sc, F, V, Si, Ge, Ti, Zr, and/or Hf; CdO doped with In and/or Sn; $CdSb_2O_6$ doped with Y; and/or combinations thereof.

7. The method of claim 2, wherein the transparent conducting oxide comprises $SnO_2$, $In_2O_3$, ZnO, CdO, and/or combinations thereof.

8. The method of claim 1, wherein the interfacial dielectric layer includes a thickness of about 4 angstroms.

9. The method of claim 1, wherein the first and second doped-conducting metal oxide layers include a thickness between about 20 angstroms and about 1,000 angstroms.

10. The method of claim 3, wherein the capping layer comprises polysilicon and a thickness between about 200 angstroms and about 1,000 angstroms.

11. The method of claim 10, wherein the capping layer comprises a thickness of about 600 angstroms.

12. The method of claim 3, wherein the capping layer comprises a metal and a thickness between about 50 angstroms and about 1,000 angstroms.

13. The method of claim 12 wherein the capping layer comprises a thickness of about 200 angstroms.

14. A method comprising:
providing a semiconductor substrate having a first active region and a second active region;
forming a first gate structure in the first active region and a second gate structure in the second active region, the first and second gate structures each including a dummy gate;
removing the dummy gate from the first gate structure, thereby forming an opening in the first gate structure;
thereafter, forming a first high-k dielectric layer, a first doped-conducting metal oxide layer over the first high-k dielectric layer, and a first conductive layer over the first doped-conducting metal oxide layer in the opening of the first gate structure, thereby forming a first transistor having a first work function;
thereafter, removing the dummy gate from the second gate structure, thereby forming an opening in the second gate structure; and
thereafter, forming a second high-k dielectric layer, a second doped-conducting metal oxide layer over the second high-k dielectric layer, and a second conductive layer over the second doped-conducting metal oxide layer in the opening of the second gate structure, thereby forming a second transistor having a second work function.

15. The method of claim 14, wherein the first or second doped-conducting metal oxide comprises $SnO_2$; $In_2O_3$; ZnO; CdO; $SnO_2$ doped with Sb, F, As, Nb, and/or Ta; $In_2O_3$ doped with Zn, Ge, Mo, F, Ti, Zr, Hf, Nb, Ta, W, Te, Ga, and/or Mg; ZnO doped with Al, Ga, B, In, Y, Sc, F, V, Si, Ge, Ti, Zr, and/or Hf; CdO doped with In and/or Sn; $CdSb_2O_6$ doped with Y; and/or combinations thereof.

16. A method for fabricating a semiconductor device, the method comprising:
forming a first gate structure and a second gate structure over a semiconductor substrate, the first and second gate structures each including a dummy gate;
removing the dummy gates from the first and second gate structures, thereby forming an opening in each of the first and second gate structures;
forming a high-k dielectric layer that partially fills the openings of the first and second gate structures;
thereafter, forming a first doped-conducting metal oxide layer over the high-k dielectric layer in the opening of the first gate structure, the first doped-conducting metal oxide layer partially filling the opening of the first gate structure;
thereafter, forming a second doped-conducting metal oxide layer over the high-k dielectric layer in the opening of the second gate structure, the second doped-conducting metal oxide layer partially filling the opening of the second gate structure;

thereafter, forming a metal layer disposed over the first and second doped-conducting metal oxide layers, wherein the metal layer fills the openings of the first and second gate structures.

17. The method of claim 16, wherein the metal layer includes aluminum.

18. The method of claim 16 further comprising:

before forming the high-k dielectric layer, forming an interfacial layer over the semiconductor substrate in the openings of the first and second gate structures, wherein the interfacial layer is disposed between the semiconductor substrate and the high-k dielectric layer.

* * * * *